United States Patent
Son et al.

(10) Patent No.: US 8,482,049 B2
(45) Date of Patent: Jul. 9, 2013

(54) SEMICONDUCTOR DEVICES AND METHODS FOR FABRICATING THE SAME

(75) Inventors: Yong-Hoon Son, Hwaseong-si (KR);
Seungjae Baik, Hwaseong-si (KR);
Jaehun Jeong, Hwaseong-si (KR);
Kihun Hwang, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 308 days.

(21) Appl. No.: 12/968,389

(22) Filed: Dec. 15, 2010

(65) Prior Publication Data

US 2011/0147824 A1 Jun. 23, 2011

(30) Foreign Application Priority Data

Dec. 16, 2009 (KR) .................. 10-2009-0125618

(51) Int. Cl.
*H01L 29/76* (2006.01)
(52) U.S. Cl.
USPC .................... 257/314; 257/329; 257/E29.309
(58) Field of Classification Search
USPC ........... 257/314, 328, 329, E29.309, E21.423
See application file for complete search history.

(56) References Cited

U.S. PATENT DOCUMENTS

| 7,679,133 | B2 | 3/2010 | Son et al. | |
|---|---|---|---|---|
| 8,309,405 | B2 * | 11/2012 | Yang et al. | 438/156 |
| 2008/0242025 | A1 * | 10/2008 | Kim et al. | 438/262 |
| 2009/0121271 | A1 | 5/2009 | Son et al. | |
| 2010/0078701 | A1 * | 4/2010 | Shim et al. | 257/314 |
| 2010/0108971 | A1 * | 5/2010 | Lee et al. | 257/2 |
| 2010/0112769 | A1 * | 5/2010 | Son et al. | 438/261 |
| 2010/0133606 | A1 * | 6/2010 | Jang et al. | 257/329 |
| 2010/0163968 | A1 * | 7/2010 | Kim et al. | 257/324 |
| 2010/0178755 | A1 * | 7/2010 | Lee et al. | 438/479 |
| 2010/0181610 | A1 * | 7/2010 | Kim et al. | 257/314 |
| 2010/0195395 | A1 * | 8/2010 | Jeong et al. | 365/185.17 |
| 2010/0213527 | A1 * | 8/2010 | Shim et al. | 257/314 |
| 2011/0156132 | A1 * | 6/2011 | Kiyotoshi | 257/326 |
| 2011/0316069 | A1 * | 12/2011 | Tanaka et al. | 257/324 |
| 2012/0068255 | A1 * | 3/2012 | Lee et al. | 257/324 |

FOREIGN PATENT DOCUMENTS

| JP | 0685200 | 3/1994 |
|---|---|---|
| JP | 06338602 | 12/1994 |
| JP | 2008171838 | 7/2008 |
| JP | 2009117843 | 5/2009 |
| KR | 1019930017168 | 8/1993 |
| KR | 101998034565 | 8/1998 |
| KR | 1019990052461 | 7/1999 |
| KR | 1020090047614 | 5/2009 |

* cited by examiner

*Primary Examiner* — Matthew Landau
*Assistant Examiner* — Joseph C Nicely
(74) *Attorney, Agent, or Firm* — Onello & Mello, LLP

(57) ABSTRACT

In semiconductor devices and methods of manufacture, a semiconductor device comprises a substrate of semiconductor material extending in a horizontal direction. A plurality of interlayer dielectric layers are on the substrate. A plurality of gate patterns are provided, each gate pattern between a neighboring lower interlayer dielectric layer and a neighboring upper interlayer dielectric layer. A vertical channel of semiconductor material is on the substrate and extending in a vertical direction through the plurality of interlayer dielectric layers and the plurality of gate patterns. The vertical channel has an outer sidewall, the outer sidewall having a plurality of channel recesses, each channel recess corresponding to a gate pattern of the plurality of gate patterns. The vertical channel has an inner sidewall. An information storage layer is present in the recess between each gate pattern and the vertical channel that insulates the gate pattern from the vertical channel.

24 Claims, 42 Drawing Sheets

SEMICONDUCTOR DEVICES AND METHODS FOR FABRICATING THE SAME

CROSS-REFERENCE TO RELATED APPLICATIONS

This U.S. patent application claims priority under 35 U.S.C. §119 to Korean Patent Application No. 10-2009-0125618, filed Dec. 16, 2009, the entire content of which is hereby incorporated by reference in its entirety.

BACKGROUND

The present disclosure relates to semiconductor devices and a method for fabricating the same, and more particularly, to vertical type nonvolatile memory devices and methods for fabricating the same.

Higher integration of semiconductor devices is desired for satisfying consumer demands for superior performance and cost reduction. In the case of semiconductor memory devices, heightened integration is especially important, since integration is an important factor in determining product price. In the case of typical two-dimensional, or planar, memory semiconductor devices, since their integration is primarily determined by the circuit area occupied by a unit memory cell, integration is greatly influenced by the ability to form fine patterns. However, since extremely expensive semiconductor equipment is required for further advancement of pattern fineness, further integration of two-dimensional memory devices is impractical.

As an alternative to address the limitations associated with two-dimensional devices, three-dimensional semiconductor memory devices have been proposed. However, to realize the mass production of three-dimensional semiconductor memory devices, process technology that can decrease fabrication cost per bit, yet can realize reliable product characteristics, is required.

SUMMARY

In one aspect, a semiconductor device comprises: a substrate of semiconductor material extending in a horizontal direction; a plurality of interlayer dielectric layers on the substrate; a plurality of gate patterns, each gate pattern between a neighboring lower interlayer dielectric layer and a neighboring upper interlayer dielectric layer; a vertical channel of semiconductor material on the substrate and extending in a vertical direction through the plurality of interlayer dielectric layers and the plurality of gate patterns, the vertical channel having an outer sidewall, the outer sidewall having a plurality of channel recesses, each channel recess corresponding to a gate pattern of the plurality of gate patterns, the vertical channel having an inner sidewall; and an information storage layer in the recess between each gate pattern and the vertical channel that insulates the gate pattern from the vertical channel.

In one embodiment, the vertical channel has a cup shape and the device further comprises a vertical channel insulator that fills a vertical cavity in the vertical channel.

In another embodiment, the vertical channel comprises first and second opposed plates that are spaced apart from each other and further comprising a vertical channel insulator between the first and second opposed plates.

In another embodiment, the device further comprises an etch stop layer positioned between a lowermost gate pattern of the plurality of gate patterns and the substrate.

In another embodiment, a lowermost gate pattern of the plurality of gate patterns is positioned in a substrate recess in a top surface of the substrate.

In another embodiment each channel recess has a rounded concave surface that is opposite a corresponding one of the gate patterns having a mating rounded convex surface, and the rounded convex surface of each gate pattern is positioned in a rounded concave surface of a corresponding channel recess.

In another embodiment, the mating rounded convex surface of the gate pattern positioned in the channel recess has a width in the vertical direction that is greater than a thickness of a body portion of the gate pattern positioned between the neighboring lower interlayer dielectric layer and the neighboring upper interlayer dielectric layer of the gate pattern.

In another embodiment, the mating rounded convex surface of the gate pattern positioned in the channel recess has a width in the vertical direction that is less than a thickness of a body portion of the gate pattern positioned between the neighboring lower interlayer dielectric layer and the neighboring upper interlayer dielectric layer of the gate pattern.

In another embodiment, a first distance between the outer sidewall and the inner sidewall of a first portion of the vertical channel adjacent the channel recess in a horizontal direction is less than a second distance between the outer sidewall and an inner sidewall of a second portion of the vertical channel adjacent the interlayer dielectric layer in the horizontal direction In another embodiment, the information storage layer further extends in a horizontal direction between the gate pattern and the neighboring upper interlayer dielectric layer; and extends in the horizontal direction between the gate pattern and the neighboring lower interlayer dielectric layer.

In another embodiment: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; control gates of memory cell transistors sharing a same layer of the device arranged in a first horizontal direction of the semiconductor device are connected to provide word lines of the semiconductor device; memory cell transistors of a common string of the semiconductor device are coupled together in series by the vertical channel; upper portions of vertical channels arranged in a second horizontal direction of the semiconductor device are connected to provide bit lines of the semiconductor device; and the semiconductor device comprises a semiconductor memory device.

In another embodiment, the inner sidewall is linear in extension in the vertical direction.

In another aspect, a semiconductor device comprises: a substrate of semiconductor material extending in a horizontal direction; a plurality of interlayer dielectric layers on the substrate; a plurality of gate patterns, each gate pattern between a neighboring lower interlayer dielectric layer and a neighboring upper interlayer dielectric layer; a vertical channel of semiconductor material on the substrate and extending in a vertical direction through the plurality of interlayer dielectric layers and the plurality of gate patterns, the vertical channel having an outer sidewall, the outer sidewall having a plurality of channel recesses, each channel recess corresponding to a gate pattern of the plurality of gate patterns, a lowermost gate pattern of the plurality of gate patterns being positioned in a substrate recess in a top surface of the substrate; and an information storage layer in the channel recess between each gate pattern and the vertical channel that insulates the gate pattern from the vertical channel.

In one embodiment, the vertical channel further has an inner sidewall, the inner sidewall being linear in extension in the vertical direction.

In another embodiment, the vertical channel has a cup shape and further comprising a vertical channel insulator that fills a vertical cavity in the vertical channel.

In another embodiment, the vertical channel is solid between the outer sidewalls.

In another embodiment, the vertical channel comprises first and second opposed plates that are spaced apart from each other and further comprising a vertical channel insulator between the first and second opposed plates.

In another embodiment, the device further comprises an etch stop layer positioned between a lowermost gate pattern of the plurality of gate patterns and the substrate.

In another embodiment, each channel recess has a rounded concave surface that is opposite a corresponding one of the gate patterns having a mating rounded convex surface, wherein the rounded convex surface of each gate pattern is positioned in a rounded concave surface of a corresponding channel recess.

In another embodiment, the mating rounded convex surface of the gate pattern positioned in the channel recess has a width in the vertical direction that is greater than a thickness of a body portion of the gate pattern positioned between the neighboring lower interlayer dielectric layer and the neighboring upper interlayer dielectric layer of the gate pattern.

In another embodiment, the mating rounded convex surface of the gate pattern positioned in the channel recess has a width in the vertical direction that is less than a thickness of a body portion of the gate pattern positioned between the neighboring lower interlayer dielectric layer and the neighboring upper interlayer dielectric layer of the gate pattern.

In another embodiment, the vertical channel further has an inner sidewall and wherein a first distance between the outer sidewall and the inner sidewall of a first portion of the vertical channel adjacent the channel recess in a horizontal direction is less than a second distance between the outer sidewall and an inner sidewall of a second portion of the vertical channel adjacent the interlayer dielectric layer in the horizontal direction In another embodiment, the information storage layer further extends in a horizontal direction between the gate pattern and the neighboring upper interlayer dielectric layer; and extends in the horizontal direction between the gate pattern and the neighboring lower interlayer dielectric layer.

In another embodiment: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; control gates of memory cell transistors sharing a same layer of the device arranged in a first horizontal direction of the semiconductor device are connected to provide word lines of the semiconductor device; memory cell transistors of a common string of the semiconductor device are coupled together in series by the vertical channel; upper portions of vertical channels arranged in a second horizontal direction of the semiconductor device are connected to provide bit lines of the semiconductor device; and the semiconductor device comprises a semiconductor memory device.

In another aspect, a semiconductor device comprises: a substrate of semiconductor material extending in a horizontal direction; a plurality of interlayer dielectric layers on the substrate; a plurality of gate patterns, each gate pattern between a neighboring lower interlayer dielectric layer and a neighboring upper interlayer dielectric layer; a vertical channel of semiconductor material on the substrate and extending in a vertical direction through the plurality of interlayer dielectric layers and the plurality of gate patterns, the vertical channel having an outer sidewall, the outer sidewall having a plurality of channel recesses, each channel recess corresponding to a gate pattern of the plurality of gate patterns; wherein each channel recess has a rounded concave surface that is opposite a corresponding one of the gate patterns having a mating rounded convex surface, and wherein the rounded convex surface of each gate pattern is positioned in a rounded concave surface of a corresponding channel recess; and an information storage layer in the channel recess between each gate pattern and the vertical channel that insulates the gate pattern from the vertical channel.

In one embodiment, the vertical channel further has an inner sidewall, the inner sidewall being linear in extension in the vertical direction.

In another embodiment, a lowermost gate pattern of the plurality of gate patterns is positioned in a substrate recess in a top surface of the substrate.

In another embodiment, the vertical channel has a cup shape and further comprising a vertical channel insulator that fills a vertical cavity in the vertical channel.

In another embodiment, the vertical channel is solid between the outer sidewalls.

In another embodiment, the vertical channel comprises first and second opposed plates that are spaced apart from each other and further comprising a vertical channel insulator between the first and second opposed plates.

In another embodiment, the device further comprises an etch stop layer positioned between a lowermost gate pattern of the plurality of gate patterns and the substrate.

In another embodiment, the mating rounded convex surface of the gate pattern positioned in the channel recess has a width in the vertical direction that is greater than a thickness of a body portion of the gate pattern positioned between the neighboring lower interlayer dielectric layer and the neighboring upper interlayer dielectric layer of the gate pattern.

In another embodiment, the mating rounded convex surface of the gate pattern positioned in the channel recess has a width in the vertical direction that is less than a thickness of a body portion of the gate pattern positioned between the neighboring lower interlayer dielectric layer and the neighboring upper interlayer dielectric layer of the gate pattern.

In another embodiment, the vertical channel further has an inner sidewall and wherein a first distance between the outer sidewall and the inner sidewall of a first portion of the vertical channel adjacent the channel recess in a horizontal direction is less than a second distance between the outer sidewall and an inner sidewall of a second portion of the vertical channel adjacent the interlayer dielectric layer in the horizontal direction In another embodiment, the information storage layer further extends in a horizontal direction between the gate pattern and the neighboring upper interlayer dielectric layer; and extends in the horizontal direction between the gate pattern and the neighboring lower interlayer dielectric layer.

In another embodiment: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; control gates of memory cell transistors sharing a same layer of the device arranged in a first horizontal direction of the semiconductor device are connected to provide word lines of the semiconductor device; memory cell transistors of a common string of the semiconductor device are coupled together in series by the vertical channel; upper portions of vertical channels arranged in a second horizontal direction of the semiconductor device are connected to provide bit lines of the semiconductor device; and the semiconductor device comprises a semiconductor memory device.

In another embodiment, a method of fabricating a semiconductor device comprises: providing a substrate extending in a horizontal direction; providing a plurality of interlayer dielectric layers on the substrate; providing a plurality of sacrificial layers on the substrate, each sacrificial layer between a neighboring lower interlayer dielectric layer and a neighboring upper interlayer dielectric layer; providing a vertical channel extending in a vertical direction through the plurality of interlayer dielectric layers and the plurality of sacrificial layers; providing a vertical opening through the plurality of interlayer dielectric layers and the plurality of sacrificial layers; providing a first etching process to remove remaining portions of the sacrificial layers exposed by the vertical opening, the first etching process exposing portions of outer sidewalls of the vertical channel; providing a second etching process to form channel recesses in the exposed outer sidewalls of the vertical channel; providing an information storage layer on the channel recesses of the vertical channel; and providing a plurality of gate patterns in the channel recesses of the vertical channel.

In another embodiment, providing the second etching process to form channel recesses forms channel recesses that each have a rounded concave surface that is opposite a corresponding one of the gate patterns having a mating rounded convex surface, and wherein the rounded convex surface of each gate pattern is positioned in a rounded concave surface of a corresponding channel recess.

In another embodiment, the mating rounded convex surface of the gate pattern positioned in the channel recess has a width in the vertical direction that is greater than a thickness of a body portion of the gate pattern positioned between the neighboring lower interlayer dielectric layer and the neighboring upper interlayer dielectric layer of the gate pattern.

In another embodiment, the mating rounded convex surface of the gate pattern positioned in the channel recess has a width in the vertical direction that is less than a thickness of a body portion of the gate pattern positioned between the neighboring lower interlayer dielectric layer and the neighboring upper interlayer dielectric layer of the gate pattern.

In another embodiment, providing an information storage layer on the channel recesses includes: providing a first portion extending in the vertical direction between each gate patterns and the corresponding channel recess; providing a second portion extending in the horizontal direction between each gate pattern and the neighboring upper interlayer dielectric layer; and providing a third portion extending in the horizontal direction between each gate pattern and the neighboring lower interlayer dielectric layer.

In another embodiment, providing the vertical channel provides the vertical channel to have a cup shape and further comprising providing a vertical channel insulator that fills a vertical cavity in the vertical channel.

In another embodiment, providing the vertical channel provides the vertical channel to comprise first and second opposed plates that are spaced apart from each other and further comprising providing a vertical channel insulator between the first and second opposed plates.

In another embodiment, providing an etch stop layer on the substrate prior to providing a plurality of interlayer dielectric layers on the substrate.

In another embodiment, providing a second etching process to form channel recesses in the exposed outer sidewalls of the vertical channel further provides a substrate recess in a top surface of the substrate and wherein a lowermost gate pattern of the plurality of gate patterns is positioned in the substrate recess.

BRIEF DESCRIPTION OF THE DRAWINGS

The accompanying drawings are included to provide a further understanding of the inventive concept, and are incorporated in, and constitute a part of this specification. The drawings illustrate exemplary embodiments of the inventive concept and, together with the description, serve to explain principles of the inventive concept. In the drawings.

DETAILED DESCRIPTION OF EMBODIMENTS

Figure 1:
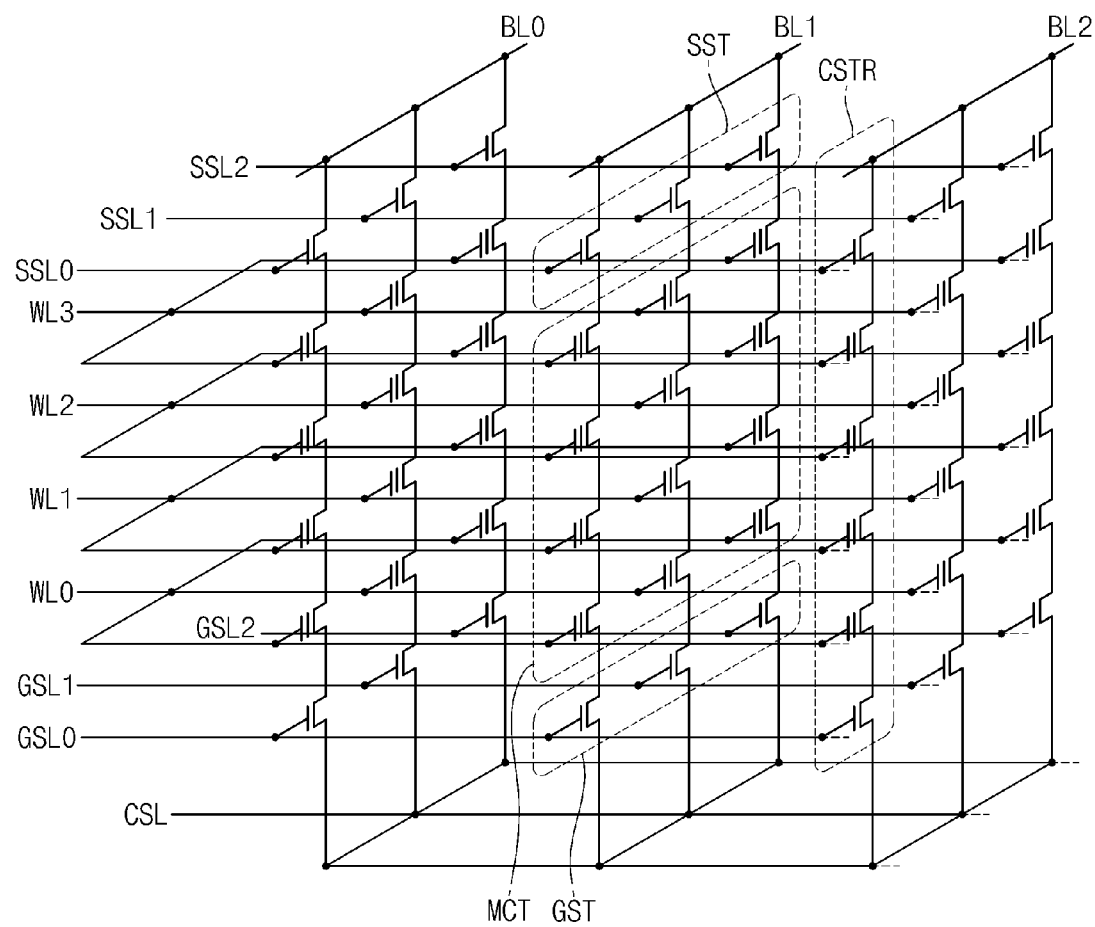
FIG. 1 is a schematic circuit diagram of a vertical type semiconductor device according to embodiments of the inventive concept.

Embodiments of the present inventive concept will now be described more fully hereinafter with reference to the accompanying drawings, in which preferred embodiments of the are shown. This inventive concept may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with reference to sectional views and/or plan views as ideal exemplary views of the inventive concept. In the figures, the dimensions of layers and regions are exaggerated for clarity of illustration. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate a specific shape of a semiconductor package region. Thus, this should not be construed as limited to the scope of the inventive concept.

Although embodiments of the inventive concept describe an information storage layer, the information storage layer may correspond to a gate dielectric layer. Otherwise, a tunnel dielectric included in the information storage layer may correspond to a gate dielectric layer.

Hereinafter, exemplary embodiments of the inventive concept will be described below in more detail with reference to the accompanying drawings. Semiconductor devices according to embodiments of the inventive concept have a three-dimensional structure.

<Embodiment 1>

Figure 2:
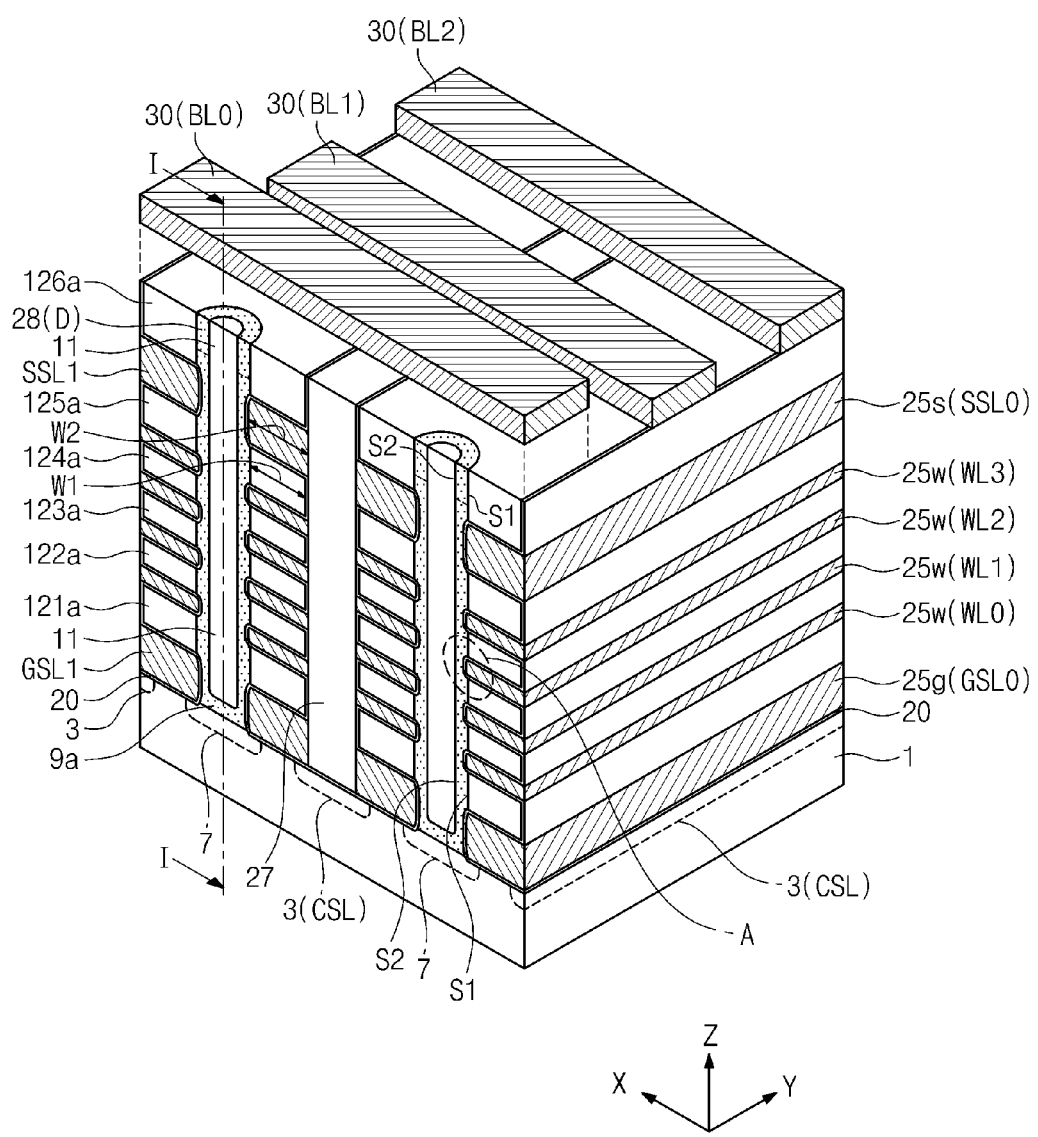
FIG. 2 is a perspective view of a vertical type semiconductor device according to embodiment 1 of the inventive concept.

FIG. 1 is a schematic circuit diagram of a vertical type semiconductor device according to embodiments of the inventive concept. FIG. 2 is a perspective view of a vertical type semiconductor device according to a first embodiment of the inventive concept.

Referring to FIGS. 1 and 2, a vertical type semiconductor device according to a first embodiment of the inventive concept may include a common source line CSL, a plurality of bit lines BL0, BL1, BL2, and a plurality of cell strings disposed between the common source line CSL and the plurality of bit lines BL0, BL1, BL2.

The common source line CSL may comprise a conductive thin film disposed on a semiconductor layer 1 or a first impurity implantation region 3 formed in the semiconductor layer 1. The semiconductor layer 1 may be a semiconductor substrate or an epitaxial semiconductor layer. The bit lines BL0, BL1, BL2 may comprise conductive patterns 30 spaced apart from, and disposed above, the semiconductor layer 1. The bit lines BL0, BL1, BL2 are arranged two-dimensionally to extend in the direction of the x-axis, and a plurality of cell strings CSTR are connected in parallel to each of the bit lines BL0, BL1, BL2. Accordingly, the plurality of cell strings CSTR are arranged in two dimensions to extend in the direction of the z-axis on the semiconductor layer 1.

Each of the plurality of cell strings CSTR may be comprised of a ground select transistor GST connected to the common source line CSL, a string select transistor SST connected to one of the bit lines BL0, BL1, BL2, and a plurality of memory cell transistors MCT disposed between the ground select transistor GST and the string select transistor SST. The ground select transistor GST, the string select transistor SST and the memory cell transistors MCT may be connected in series with one another. Further, a plurality of ground select lines GSL, a plurality of word lines WL0-WL3 and a plurality of string select lines SSL0-SSL2 disposed between the common source line CSL and the plurality of bit lines BL0, BL1, BL2 may be used as, or connected to, gates of the ground select transistors GST, memory cell transistors MCT and the string select transistors SST, respectively.

In one embodiment, the ground select transistors GST are disposed at a substantially equal distance from the semiconductor layer 1, and gate electrodes of the ground select transistors GST are commonly connected to the ground select line GSL, and thus may be in an equipotential state. Similarly, gate electrodes of the plurality of memory cell transistors MCT disposed at a substantially equal distance from the common source line CSL are commonly connected to one of the word lines WL0-WL3 and thus may be in an equipotential state. Each cell string CSTR is comprised of two or more memory cell transistors MCT having different distances from the common source line CSL, and word lines WL0-WL3 are disposed between the common source line CSL and the bit lines BL0-BL2, each word line servicing memory cell transistors of a common layer of the device.

Each of the cell strings CSTR may include an active pillar 9a extending vertically from the semiconductor layer 1 at one end and connected to the bit lines BL0-BL2 at a second end. The active pillar 9a may be formed to penetrate in a vertical direction along the z-axis, one of the string select lines SSL0-SSL2, the word lines WL0-WL3, and one of the ground select lines GSL0-GLS2.

An information storage layer 20 can be disposed between the word lines WL0-WL3 and the active pillar 9a. According to an embodiment of the inventive concept, the information storage layer 20 may include a tunnel dielectric layer, a charge trapping layer, and a blocking layer. In certain embodiments, the charge trapping layer is not present between the ground select line GSL and the active pillar 9a and between the string select lines SSL and the active pillar 9a.

The ground select transistors GST, the string select transistors SST and the memory cell transistors MCT can comprise MOSFETs using the active pillar 9a as a channel region.

Continuously referring to FIG. 2, gate patterns 25g, 25w, 25s and intergate dielectric patterns 121a, 122a, 123a, 124a, 125a, 126a are alternatingly and repeatedly stacked on the semiconductor layer 1. The semiconductor layer 1 has an upper plane that extends in a first direction X and in a second direction Y that is perpendicular to the first direction X, and the gate patterns 25g, 25w, 25s and the intergate dielectric patterns 121a, 122a, 123a, 124a, 125a, 126a are stacked in a third direction Z which is perpendicular to the first direction X and the second direction Y. Although not shown in the drawings, a well region may be formed in the semiconductor layer 1. For example, a P-type impurity layer operating as a well region can be formed in the semiconductor layer 1. A first impurity implantation region 3 may be disposed at a predetermined region in the semiconductor layer 1 in a line form extending in the second direction Y. In one embodiment, the first impurity implantation region 3 may be an N$^+$-type impurity layer. The first impurity implantation regions 3 may be connected with each other at a predetermined region. The first impurity implantation region 3 may be disposed at a position in the substrate that is overlapped the gate patterns 25g, 25w, 25s in a vertical direction.

The active pillar 9a penetrates the gate patterns 25g, 25w, 25s and the intergate dielectric patterns 121a, 122a, 123a, 124a, 125a, 126a to contact the semiconductor layer 1. The active pillar 9a may be disposed to be spaced apart from the first impurity implantation region 3. The active pillar 9a may be formed of, for example, an impurity-doped polysilicon or undoped polysilicon. In the embodiment depicted, the active pillar 9a has a hollow cup shape. An interior of the active pillar 9a can be filled with an inner insulation pattern 11. Alternatively, the active pillar may have a solid pillar shape. The gate patterns 25g, 25w, 25s may comprise an impurity-doped polysilicon layer and/or a metal-containing layer such as a metal layer, a metal nitride layer and a metal silicide layer. The gate patterns 25g, 25w, 25s can include a ground select gate pattern 25g, a word line gate pattern 25w and a string select gate pattern 25s. As shown in FIG. 2, a buried insulation pattern 27, which penetrates gate patterns 25s, 25w, 25g and the intergate dielectric patterns 121a, 122a, 123a, 124a, 125a, 126a, is disposed between active pillars 9a that neighbor each other in the first direction X. In one embodiment, the buried insulation pattern 27 does not penetrate the ground selection gate pattern 25g; in other embodiments, the buried insulation pattern 27 can optionally penetrate the ground selection gate pattern 25g. The buried insulation pattern 27 can have a line-shaped form that extends in the second direction Y. The string select gate pattern 25s can be separated by the buried insulation pattern 27 so as to form two or more lines extending in the second direction Y on a single plane. Further, the word line gate pattern 25w can be separated by the buried insulation pattern so as to form two or more lines extending in the second direction Y on a single plane. However, the two or more neighboring lines of the word line gate pattern 25w, which are separated on a single plane by the buried insulation pattern 27, can optionally be connected to each other at a predetermined region of the device not shown in FIG. 2, and thus the word line gates 25w positioned on the single plane (i.e., X-Y plane) may therefore be commonly connected as shown in the circuit diagram of FIG. 1. A second impurity implantation region 7 may be disposed in the semiconductor layer below the active pillar 9a. The second impurity implantation region 7 may be doped with an impurity having a conductivity type that is different from that of the first impurity implantation region 3. The second impurity implantation region 7 may be provided so as to control a threshold voltage of a ground select transistor including the ground select gate pattern 25g. A third impurity implantation region 28 may be disposed at an upper end of the active pillar 9a. The third impurity implantation region 28 may be doped with an impurity having a conductivity type that is the same as that of the first impurity implantation region 3. The third impurity implantation region 28 can function as a drain for the memory cell string CSTR. The intergate dielectric patterns 121a, 122a, 123a, 124a, 125a, 126a may include first to sixth intergate dielectric patterns 121a, 122a, 123a, 124a, 125a, 126a sequentially stacked starting with the first intergate dielectric pattern 121a. A conductive line 30 extending in the first direction and contacting the third impurity implantation region 28 of each pillar 9a is disposed on the sixth intergate dielectric pattern 126a, which is the uppermost layer among the first to sixth intergate dielectric patterns 121a, 122a, 123a, 124a, 125a, 126a. The conductive line 30 can correspond to the bit lines BL0-BL2.

Figure 3:
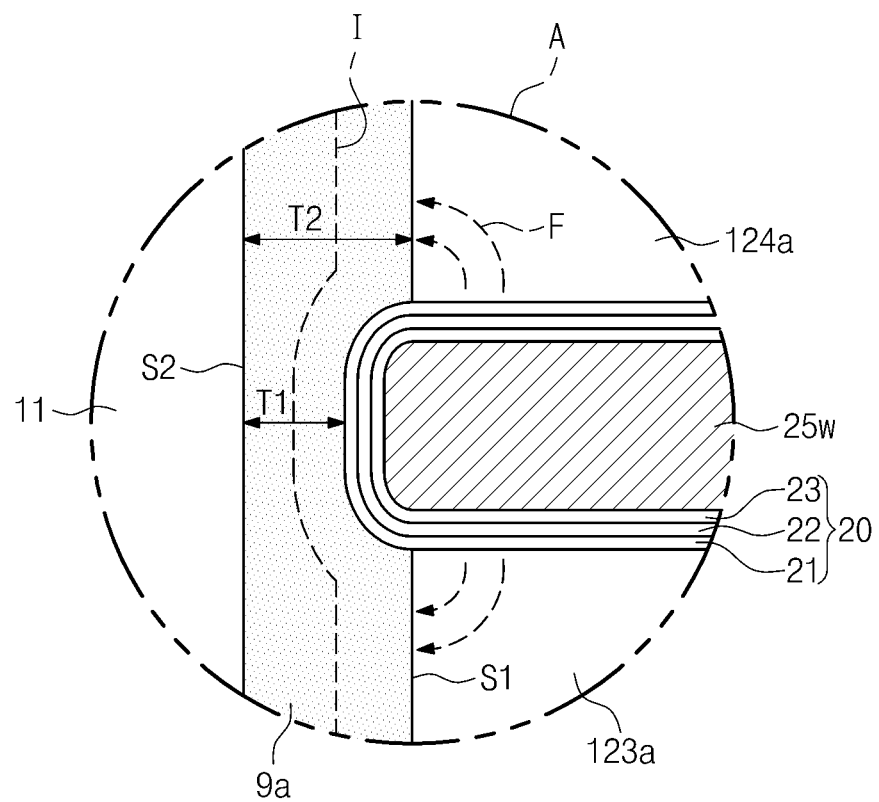
FIG. 3 is a detailed view of portion A in FIG. 2.

FIG. 3 is a detailed view of portion A in FIG. 2.

Referring to FIGS. 2 and 3, the information storage layer 20 can be disposed between the active pillar 9a and the gate patterns 25s, 25w, 25g. The information storage layer 20 can include a tunnel dielectric layer 21, a charge trapping layer 22 and a blocking layer 23. The information storage layer 20 at the lowermost layer associated with the ground select gate pattern 25g can extend between the semiconductor layer 1 and the ground select gate pattern 25g. The active pillar 9a has an outer sidewall S1 in contact with the information storage layer 20, and an inner sidewall S2 in contact with the inner insulation pattern 11. The outer sidewall S1 has an irregular structure. That is, a width W1 of the intergate dielectric patterns 121a, 122a, 123a, 124a, 125a, 126a in the first direction X (see FIG. 2) is smaller than a width W2 of the gate patterns 25g, 25w, 25s in the first direction X. In this manner, one end of the gate patterns 25g, 25w, 25s adjacent to the sidewall of the active pillar 9a vertically overlaps the outer sidewall S1 of the active pillar 9a. In other words, a portion of the gate patterns 25g, 25w, 25s can be considered to protrude into an outer sidewall S1 of the active pillar 9a. In various embodiments, the outer sidewall S1 of the active pillar is considered to have a recess, also referred to herein as a channel recess, that is concave, and the outer sidewall of the gate pattern is convex and mates with the channel recess of the active pillar. An information storage layer is positioned between them. In various embodiments, the channel recesses are rounded in shape.

Returning to FIG. 3, in this embodiment, a first thickness T1 of the wall of a portion of the active pillar 9a adjacent, in a horizontal direction, to the gate patterns 25g, 25w, 25s in the first direction X is less than a second thickness T2 of the wall of a portion of the active pillar 9a adjacent, in a horizontal direction, to the intergate dielectric patterns 121a, 122a, 123a, 124a, 125a, 126a in the first direction X. By doing so, the sidewall of the active pillar 9a can be considered to have an irregular structure. Thus, as the outer sidewall S1 of the active pillar 9a has the irregular structure, a distance from a point on the outer sidewall S1 of the active pillar 9a to a point on an upper or lower surface of one of the gate patterns 25g, 25w, 25s is relatively closer in the present configuration due to the presence of the recess, as compared to a configuration in which the gate pattern 25g, 25w, 25s does not protrude into the outer sidewall of the active pillar. As a result, when a voltage is applied to the gate patterns 25g, 25w, 25s, the influence of a resulting fringe field F on the active pillar 9a can be relatively increased in the present configuration. Thus, an inversion region I may be more readily formed in the outer sidewall S1 of the active pillar 9a. As a result, the amount of ON current in the channel region is increased, so that sensing margin of the resulting device can be increased. Also, in the present configuration, as the first thickness T1 of the active pillar 9a, which will become a channel region, is made relatively thinner, the possibility of a boundary existing between grains of polysilicon is decreased. In one embodiment, the first thickness T1 is less than an average size of the polysilicon grain size. Accordingly, as the first thickness T1 is decreased, the resulting probability that charge can be trapped in the grains of polysilicon is also decreased. That is, the trap density in the channel region is decreased. As a result, variation in the threshold voltages of transistors including the gate patterns 25s, 25w, 25g is likewise decreased.

Meanwhile, a portion of the active pillar 9a that is adjacent to the intergate dielectric patterns 121a, 122a, 123a, 124a, 125a, 126a and corresponds to a source/drain region of the memory cell transistors, has a second thickness T2. Since the second thickness T2 is relatively greater than the first thickness T1, the cross-sectional area of the portion of the active pillar 9a that is adjacent to the intergate dielectric patterns 121a, 122a, 123a, 124a, 125a, 126a, is relatively large. Therefore, when charge migrates through this portion, the electrical resistance is decreased. Accordingly, when the semiconductor device is operated, the transmission rate of electrical signals can be increased. Further, since the contact area between the active pillar 9a and the information storage layer 20 is relatively increased as a result of the indentation, the channel length is effectively increased, and thus limitations due to the short channel effect can be controlled. Also, in the present embodiment, a contact boundary surface between the active pillar 9a and the information storage layer 20 is generally rounded, without any sharply angled portions. As a result, electric field is not concentrated on one position, but is instead dispersed; thus, degeneration of the information storage layer 20 over time can be prevented. As a result, reliability of the resulting vertical type semiconductor memory device can be enhanced. In the present embodiment, the inner sidewall S2 of the active pillar 9a is linear in the sense that it is generally straight in shape in the vertical direction Z of extension.

Figure 4A:
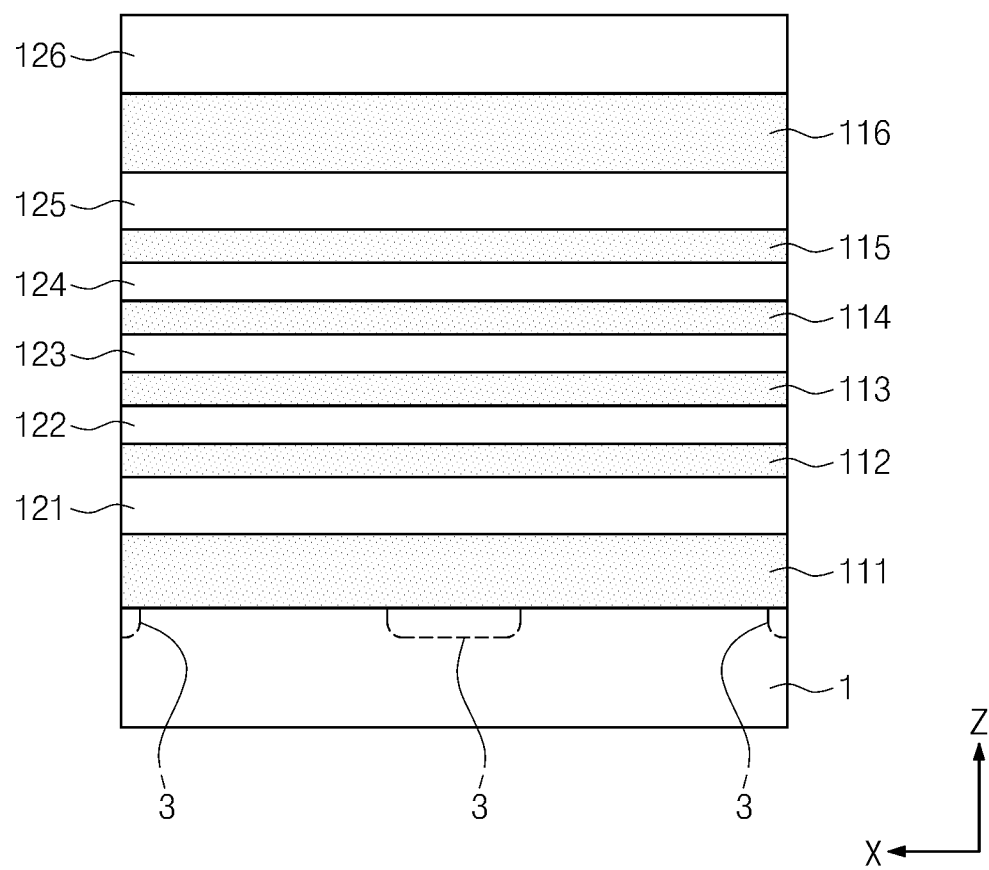
FIGS. 4A through 4H are cross-sectional views in the X-Z plane of FIG. 2 sequentially illustrating a method for fabricating a semiconductor device.

Next, a method for fabricating a semiconductor device will be described with reference to FIGS. 4A through 4H. FIGS. 4A through 4H are cross-sectional views in the X-Z plane of FIG. 2 sequentially illustrating a method for fabricating a semiconductor device;

Referring to FIG. 4A, a first impurity implantation region 3 is formed in a semiconductor layer 1 having a P-type well. In one embodiment, the first impurity implantation region 3 can be a region doped with an N-type impurity. Sacrificial layers 111-116 and intergate dielectric layers 121-126 are alternatingly stacked on the semiconductor layer 1. The sacrificial layers may include first to sixth sacrificial layers 121-126. The intergate dielectric layers 121-126 may include first to sixth intergate dielectric layers 121-126. The sacrificial layers 111-116 can comprise a material having an etch selectivity with respect to the intergate dielectric layers 121-126 and the semiconductor layer 1. The sacrificial layers 111-116 may comprise, for example, a silicon nitride layer or a silicon germanium layer.

Figure 4B:
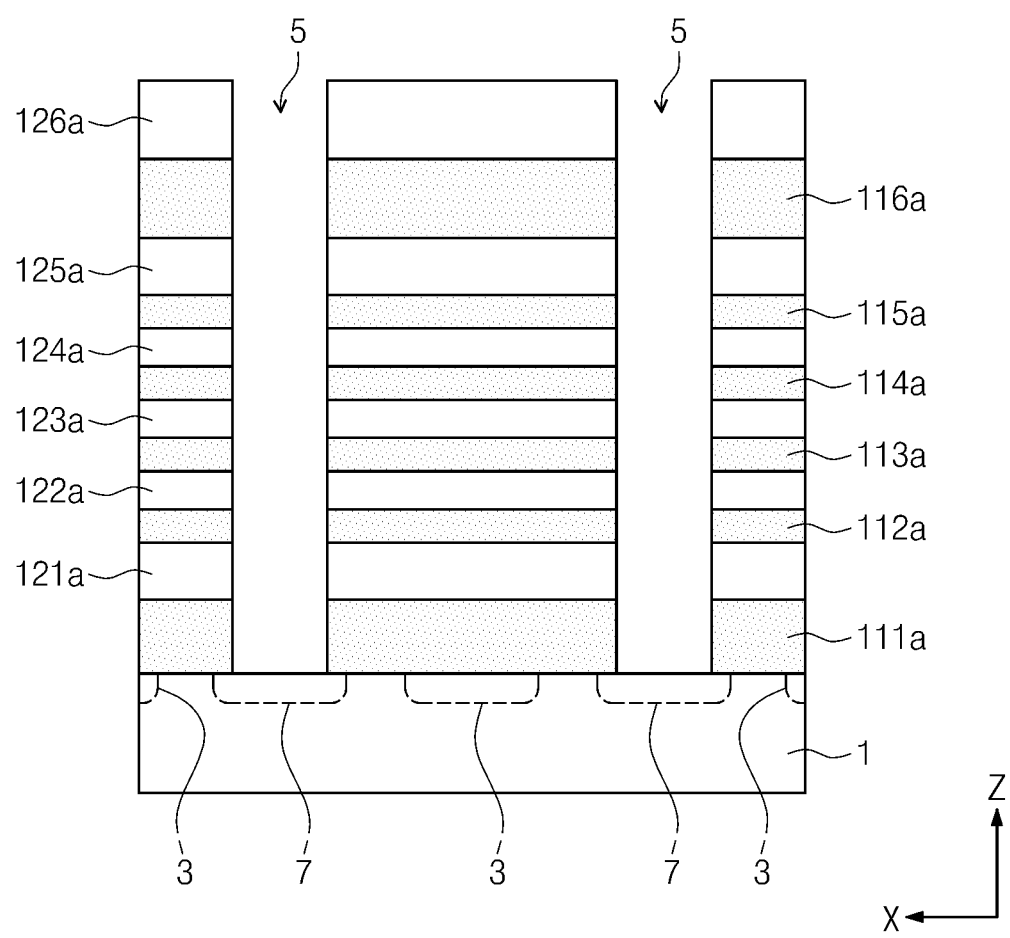

Referring to FIG. 4B, the intergate dielectric layers 121-126 and the sacrificial layers 111-116 are sequentially patterned to form a first opening 5 exposing the semiconductor layer 1. By doing so, the intergate dielectric layers 121-126 become intergate dielectric patterns 121a-126a and the sacrificial layers become sacrificial layer patterns 111a-116a. In this embodiment, the first opening 5 may have a hole shape. A second impurity implantation region 7 is formed in the semiconductor layer 1 exposed through the first opening 5 by using an ion implantation process. The second impurity implantation region 7 may be doped with a P-type impurity or an N-type impurity.

Figure 4C:
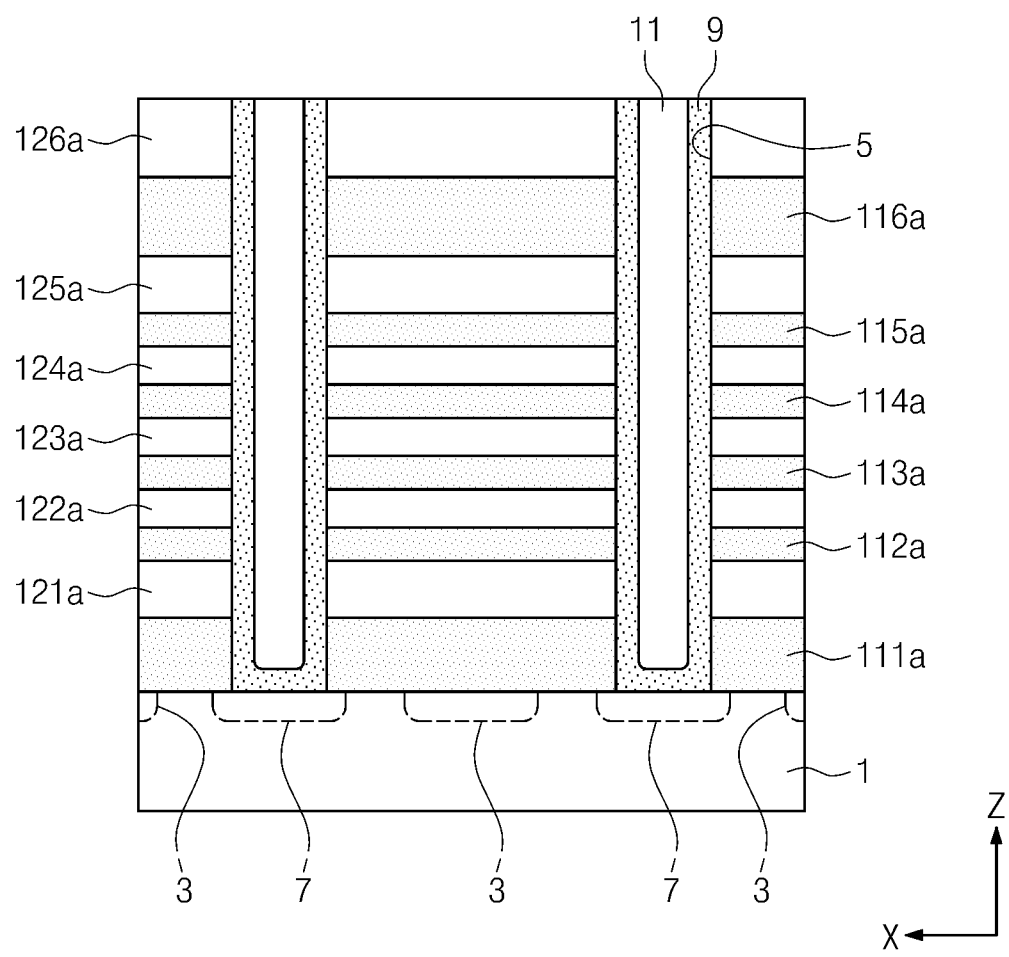

Referring to FIG. 4C, a cup-shaped active pillar 9 is formed, covering a sidewall and a bottom of the first opening 5. An inner insulation pattern 11 filling an inside of the active pillar 9 is then provided. In one embodiment, the active pillar 9 and the inner insulation pattern 11 can be formed according to the following method. First, a polysilicon layer is conformally formed on an entire surface of the semiconductor layer 1 including the first opening 5, for example, using a deposition process such as CVD, and then a dielectric layer is formed to fill the first opening 5. Thereafter, a planarizing process is performed such that the active pillar 9 and the inner insulation pattern 11 remain in the first opening 5. The active pillar 9 may be formed into a single crystalline silicon layer by depositing the polysilicon layer through a deposition process and performing a solid phase epitaxy (SPE) process. For this purpose, the polysilicon layer may be recrystallized by selectively irradiating a laser beam onto the polysilicon layer to apply heat, resulting in a single crystalline layer.

Figure 4D:
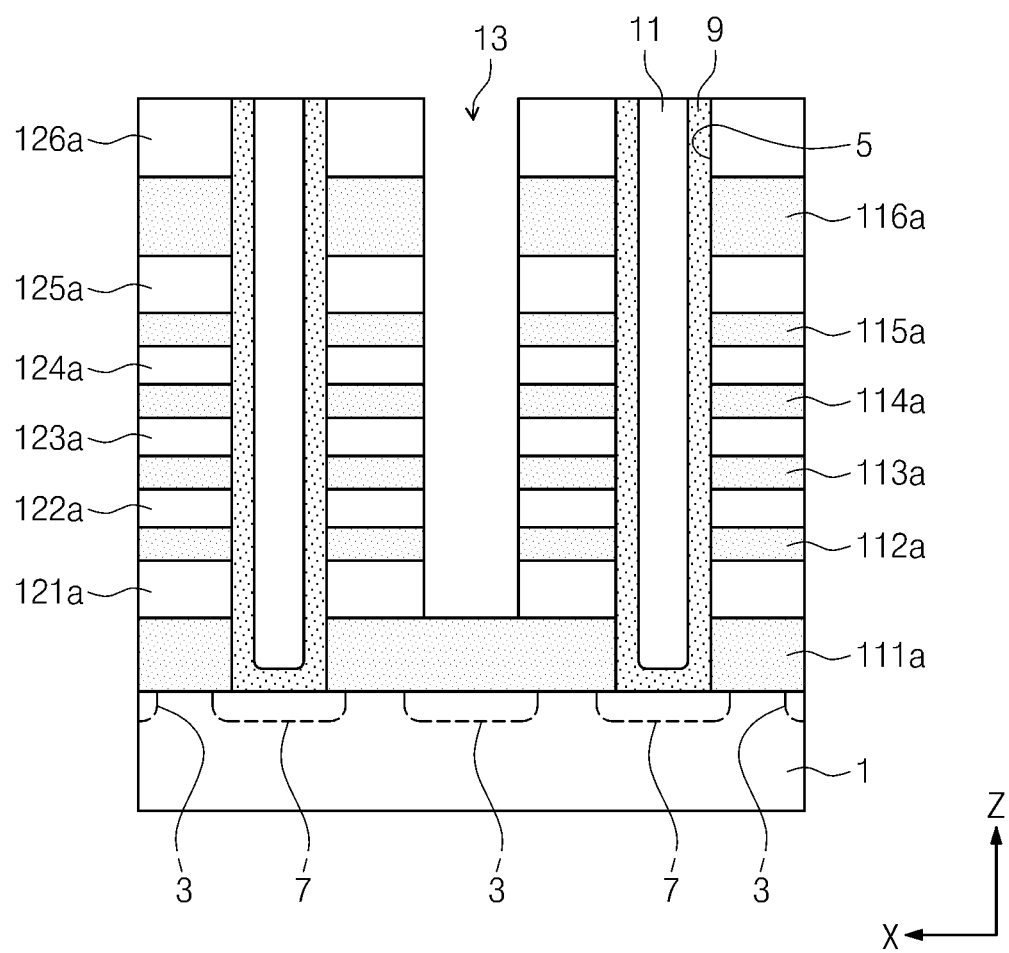

Referring to FIG. 4D, the intergate dielectric patterns 121a-126a and the sacrificial layer patterns 112a-116a between the neighboring active pillars 9 are patterned to form a second opening 13 exposing the first sacrificial layer pattern 111a positioned at the lowermost layer. The second opening 13 may have a groove shape, and may be formed at a position overlapping the first impurity implantation region 3. Alternatively, when the second opening 13 is formed, the first sacrificial layer pattern 111a may be also patterned to expose the semiconductor layer 1. In this case, the first impurity implantation region 3 is not formed in advance in the semiconductor layer 1 as shown in FIG. 4A but rather is instead formed through the second opening 13 during the procedure shown in FIG. 4D.

Figure 4E:
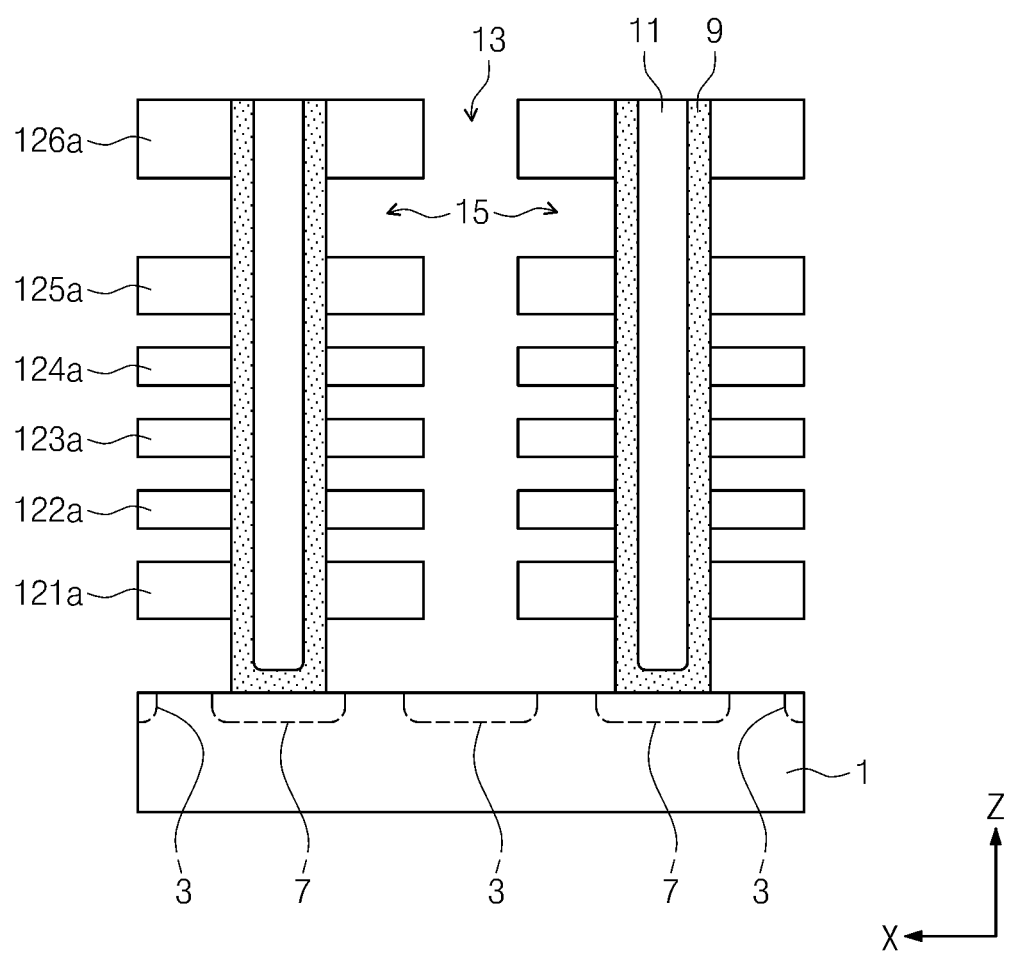

Referring to FIG. 4E, the sacrificial layer patterns 111a-116a exposed by the second opening 13 are selectively removed. At this time, the removing of the sacrificial layer patterns 111a-116a may be performed by using an etch gas or etchant that can selectively remove only the sacrificial layer patterns 111a-116a, without etching the intergate dielectric patterns 121a-126a and the semiconductor layer 1. As the sacrificial layer patterns 111a-116a are removed, a gate formation region 15 is formed at portions where the sacrificial layer patterns 111a-116a were formerly positioned. At the gate formation region 15, an outer sidewall of the active pillar 9, top, side, and bottom surfaces of the intergate dielectric patterns 121a-126a and a top surface of the semiconductor layer 1 are exposed.

Figure 4F:
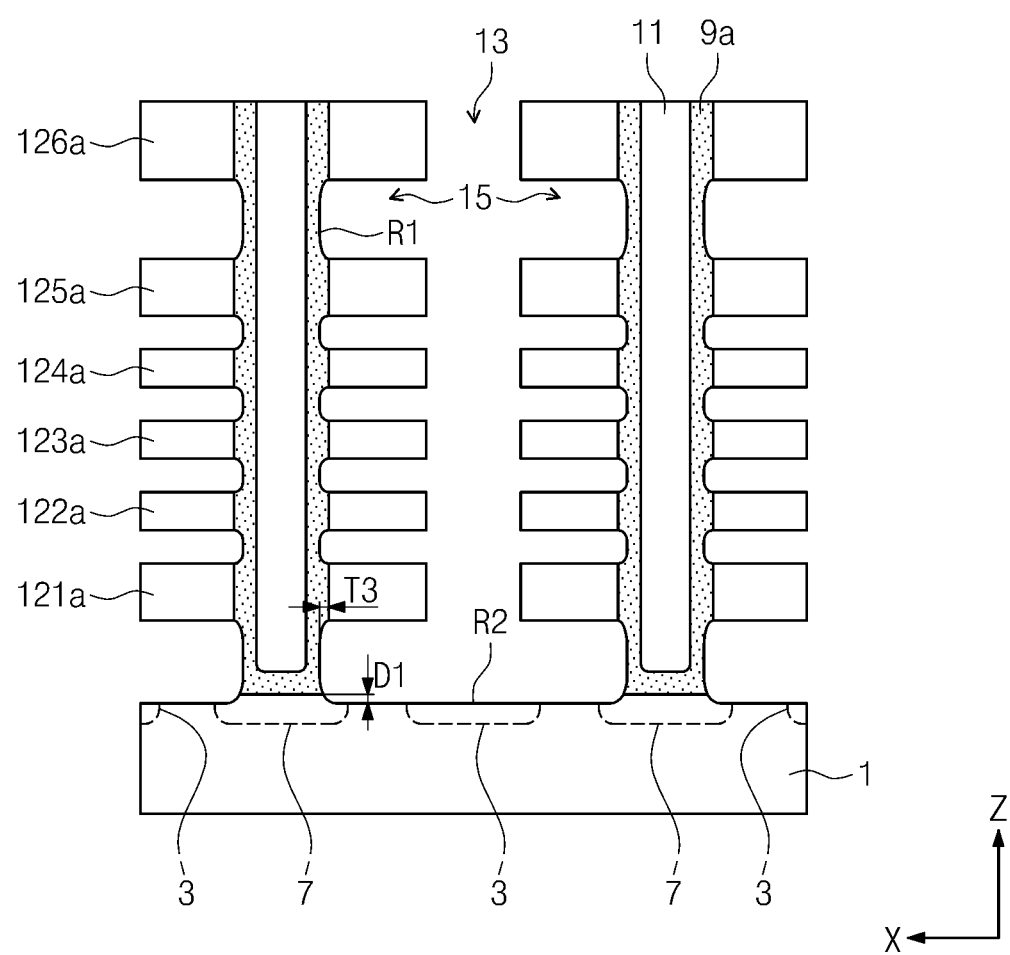

Referring to FIG. 4F, the outer sidewall of the active pillar 9 exposed by the gate formation region 15 is removed by a third thickness T3 using an isotropic etch process to form a first recessed region R1. In the case where the active pillar 9 is formed of polysilicon or single crystalline silicon and the semiconductor layer 1 is formed of single crystalline silicon, when the sidewall of the active pillar 9 is recessed, the top surface of the semiconductor layer 1 is also recessed by a first depth D1, so that a second recessed region R2, also referred to as a substrate recess, in the top of the semiconductor layer 1 can also be formed. The third thickness T3 may be equal or similar to the first depth D1. Alternatively, the third thickness T3 may be greater than the first depth D1. Characteristics of the isotropic etch process allow the recessed regions R1 and R2 to have a rounded surface as shown in FIG. 4F. As a result of the isotropic etch process, the active pillar 9 is transformed to become an active pillar 9a having a sidewall with an irregular surface, in the sense that it has recessed regions R1 between the intergate dielectric patterns 121a-126a.

Figure 4G:
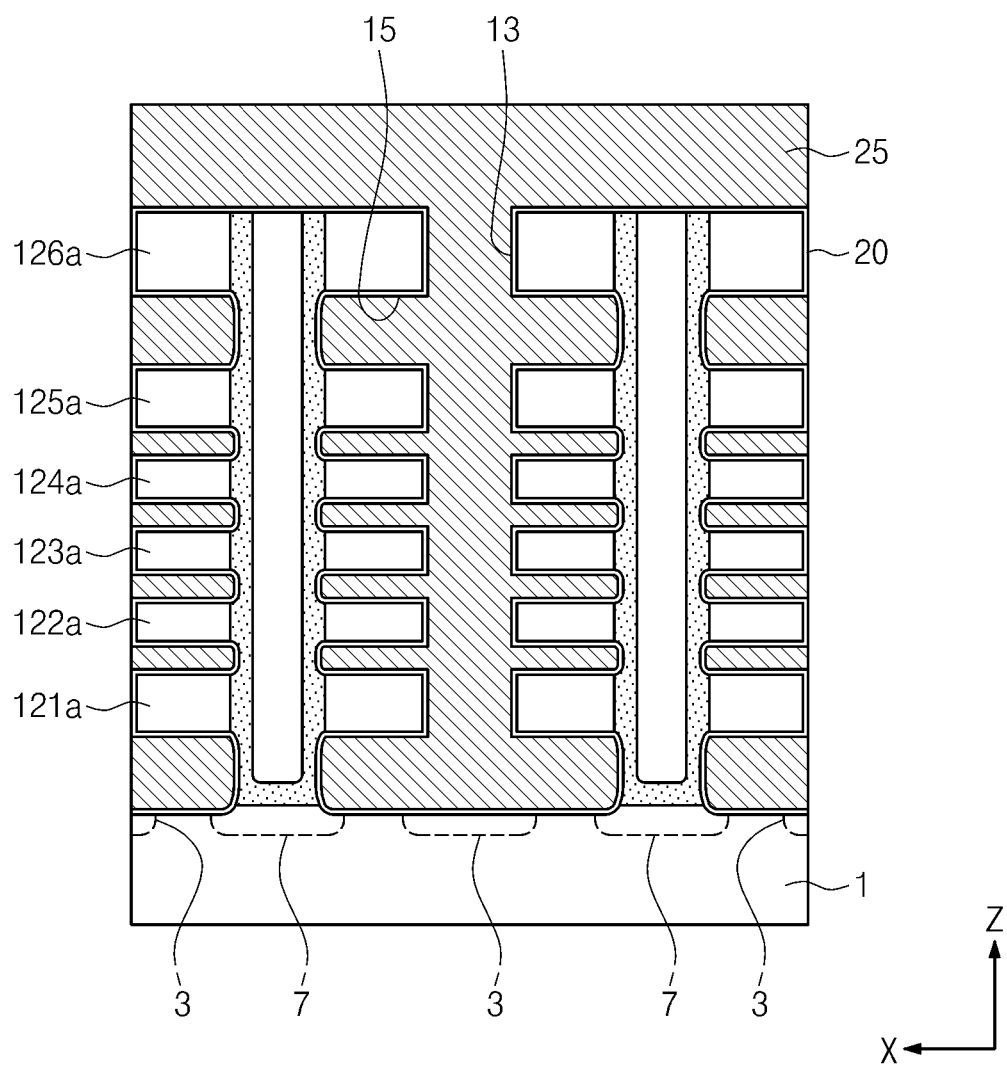

Referring to FIG. 4G, an information storage layer 20 is conformally formed on the resulting structure. As described with reference to FIG. 3, the information storage layer 20 may include the tunnel dielectric layer (see 21 of FIG. 3), the charge trapping layer (see 22 of FIG. 3), and the blocking layer (see 23 of FIG. 3). The tunnel dielectric layer 21 can be formed using a thermal oxidation process or a deposition process such as a CVD. The tunnel dielectric layer 21 may be formed on the exposed sidewall of the active pillar 9a and on a surface of the semiconductor layer 1 at both sides of the active pillar 9a. The charge trapping layer 22 may be formed of silicon nitride or the like through a deposition process. The blocking layer 23 may be formed of silicon oxide or a high-k dielectric material such as aluminum oxide through a deposition process. The charge trapping layer 22 and the blocking layer 23 may be conformally formed on all surfaces exposed in the structure of FIG. 4F. That is, the charge trapping layer 22 and the blocking layer 23 are conformally formed on the sidewall and the top surface of the active pillar 9a, on the surface of the semiconductor layer 1 at both sides of the active pillar 9a, and on sidewalls, top surfaces and bottom surfaces of the intergate dielectric patterns 121a-126a. After the information storage layer 20 is formed, a gate layer 25 is deposited to fill the second opening 13 and the gate formation region 15. In various embodiments, the gate layer 25 may be an impurity doped polysilicon layer and/or a metal containing layer.

Figure 4H:
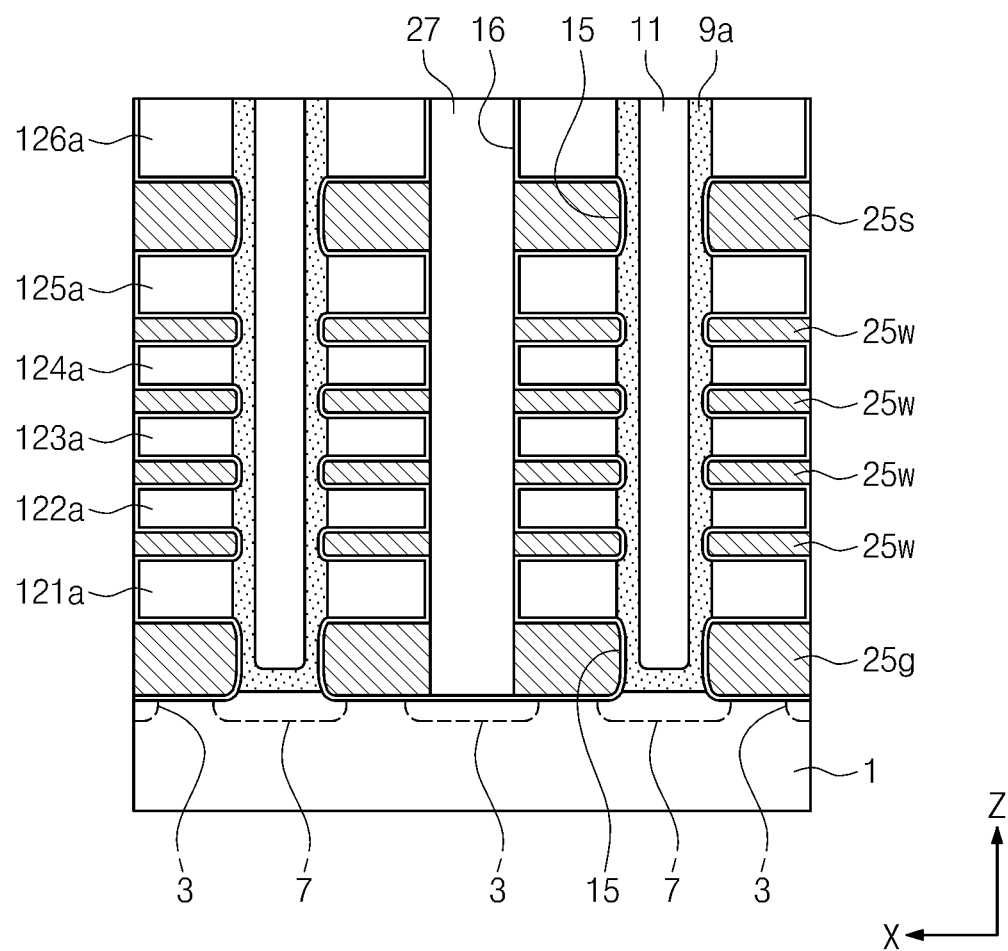

Referring to FIG. 4H, the gate layer 25 and the information storage layer 20 on the sixth intergate dielectric pattern 126a, that is the uppermost layer among the intergate dielectric patterns 121a-126a, are removed through a planarizing process to expose the top surface of the sixth intergate dielectric pattern 126a. As a result, the gate layer 25 remains in the second opening 13 and the gate formation region 15. The gate layer 25 is again etched at a position overlapping the second opening 13 to form a third opening 16. The third opening 16 can, in one embodiment, expose the first impurity implantation region 3 formed in the semiconductor layer 1. Alternatively, when the third opening 16 is formed, the gate layer 25 in the gate formation region 15 positioned at the lowermost level among the gate formation regions 15 is not etched. That is, the third opening 16 may expose a top surface of the gate layer 25 in the gate formation region 15 positioned at the lowermost level among the gate formation regions 15. Due to the formation of the third opening 16, a ground select gate pattern 25g is formed in the gate formation region 15 positioned at the lowermost level among the gate formation regions 15, a string select gate pattern 25s is formed at the uppermost level among the gate formation regions 15, and word line gate patterns 25w are formed in the gate formation regions 15 positioned between the uppermost gate formation region and the lowermost gate formation region. In the case where the ground select gate pattern 25g is not separated by the buried insulation pattern 27, the ground select gate pattern 25g is commonly connected on a single X-Y plane.

Next, again referring back to FIG. 2, an ion implantation process is performed with respect to an upper portion of the active pillar 9a to form a third impurity implantation region 28. Thereafter, a conductive layer is deposited on the sixth intergate dielectric pattern 126a and then patterned to form a conductive line 30 extending in the first direction X and contacting the third impurity implantation region 28 positioned at the upper portion of the active pillar 9a. Although not shown in the drawings, a subsequent process for forming an interconnection to apply an electrical signal to the word line gate patterns 25w of each layer may be added. At this time, the word line patterns 25w positioned on the single X-Y plane may be commonly connected.

<Embodiment 2>

Figure 5:
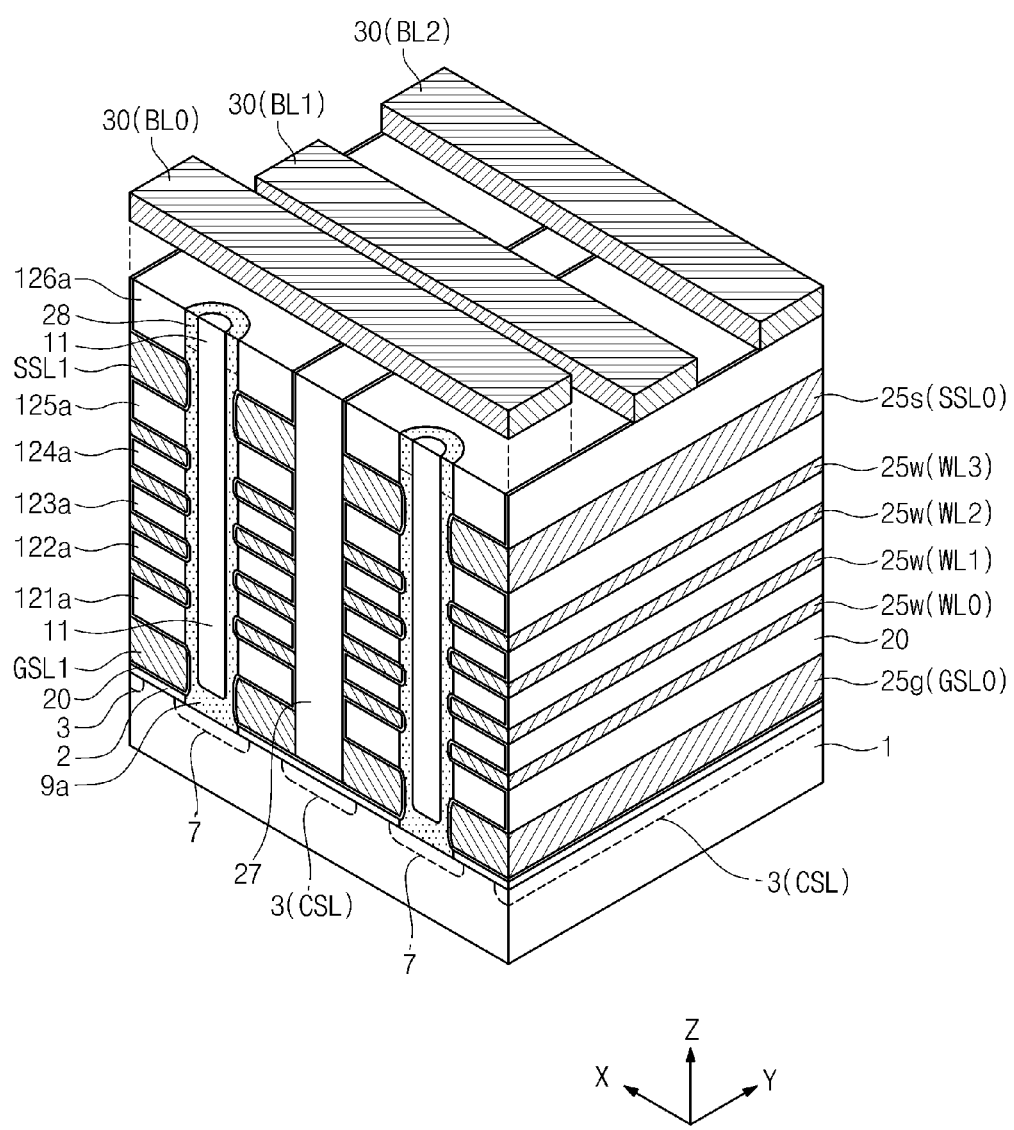
FIG. 5 is a perspective view of a vertical type semiconductor device according to a second embodiment of the inventive concept.

FIG. 5 is a perspective view of a vertical type semiconductor device according to a second embodiment of the inventive concept.

Referring to FIG. 5, in a vertical type semiconductor device according to this embodiment, an etch stop layer 2 is disposed between the information storage layer 20 positioned below the ground select gate pattern 25g, and the semiconductor layer 1. The active pillar 9a penetrates the etch stop layer 2 to contact the semiconductor layer 1. In this embodiment, a top surface of the semiconductor layer 1 is not recessed. The remaining elements other than the foregoing are similar to those of the first embodiment.

FIGS. 6A through 6D are cross-sectional views in the X-Z plane of FIG. 5 sequentially illustrating a method for fabricating a semiconductor device.

Figure 6A:
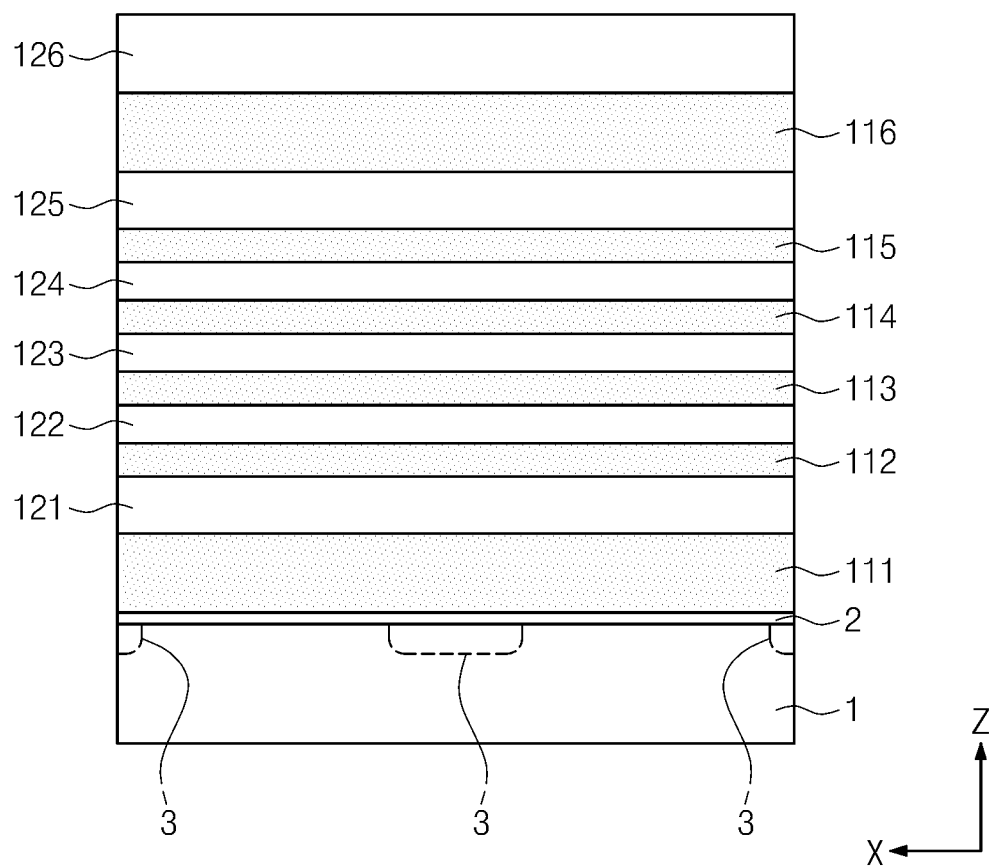
FIGS. 6A through 6D are cross-sectional views in the X-Z plane of FIG. 5 sequentially illustrating a method for fabricating a semiconductor device.

Referring to FIG. 6A, an etch stop layer 2 is stacked on a semiconductor layer 1. The etch stop layer 2 may be formed of a material having an etch selectivity with respect to the semiconductor layer 1, and sacrificial layers 111-116 and an active pillar 9 which to be formed during subsequent steps in the fabrication process. In this embodiment, the etch stop layer 2 may comprise, for example, a silicon oxide layer. Thereafter, a first impurity implantation region 3 is formed in the semiconductor layer 1. Alternatively, the forming of the first impurity implantation region 3 may be performed before the etch stop layer 2 is formed. Sacrificial layers 111-116 and intergate dielectric layers 121-126 are alternatingly stacked on the etch stop layer 2. The sacrificial layers may include first to sixth sacrificial layers 121-126. The intergate dielectric layers 121-126 may include first to sixth intergate dielectric layers 121-126. The sacrificial layers 111-116 may include a material having an etch selectivity with respect to the intergate dielectric layers 121-126 and the semiconductor layer 1. The sacrificial layers 111-116 may be, for example, a silicon nitride layer or a silicon germanium layer.

Figure 6B:
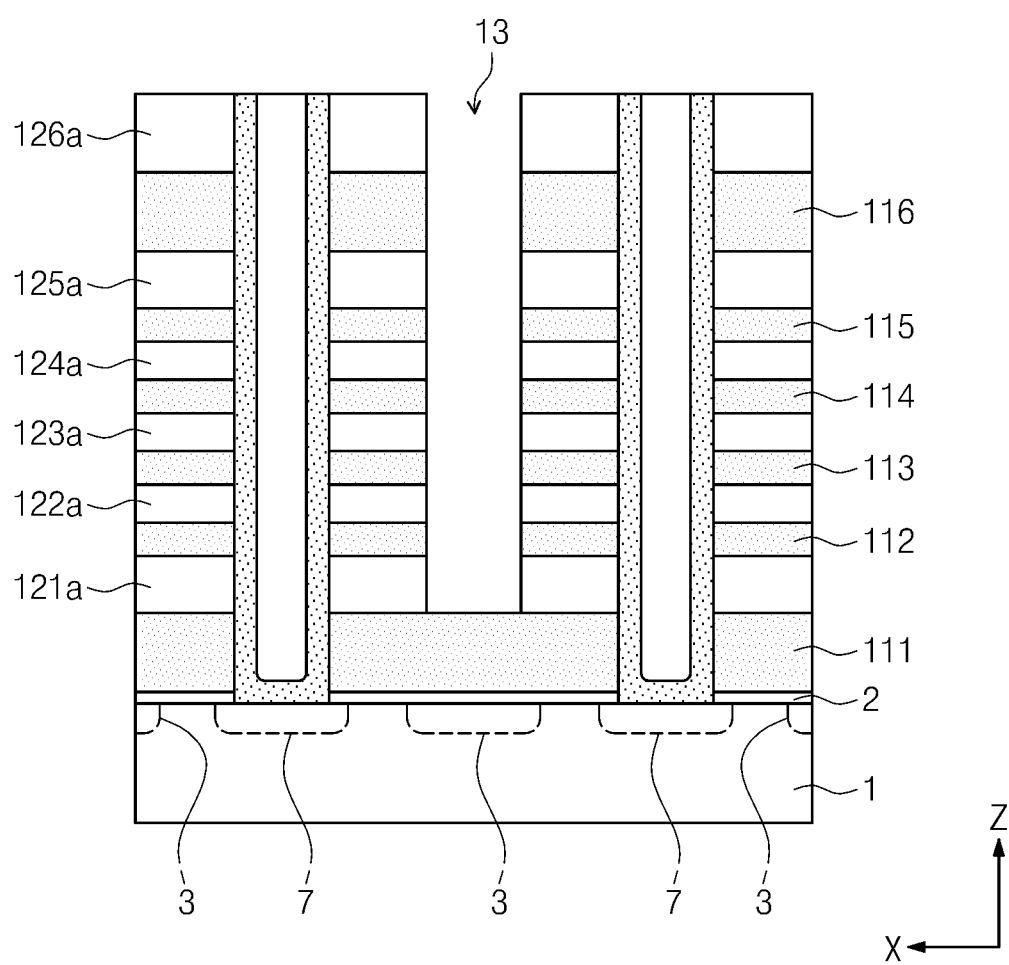

Referring to FIG. 6B, the intergate dielectric layers 121-126, the sacrificial layers 111-116 and the etch stop layer 2 are sequentially patterned to form a first opening 5 exposing the semiconductor layer 1 (see FIG. 4B, above). As a result, the intergate dielectric layers 121-126 become intergate dielectric patterns 121a-126a and the sacrificial layers become sacrificial layer patterns 111a-116a. In this embodiment, the first opening 5 may have a hole shape. A second impurity implantation region 7 is formed in the semiconductor layer 1 exposed through the first opening 5 by using an ion implantation process. Next, a cup-shaped active pillar 9 covering a sidewall and a bottom of the first opening 5, and an inner insulation pattern 11 filling an inside of the active pillar 9 are formed. Returning to FIG. 6B, the intergate dielectric patterns 121a-126a and the sacrificial layer patterns 112a-116a between the neighboring active pillars 9 are next patterned to form a second opening 13 exposing the first sacrificial layer pattern 111a positioned at the lowermost layer. The second opening 13 may have a groove shape, and may be formed at a position that overlaps the first impurity implantation region 3. Alternatively, when the second opening 13 is formed, the first sacrificial layer pattern 111a may be also patterned to expose the etch stop layer 2. In this case, the first impurity implantation region 3 is not formed in advance in the semiconductor layer 1 as shown in FIG. 6A but may be formed through the second opening 13 during the process of FIG. 6B.

Figure 6C:
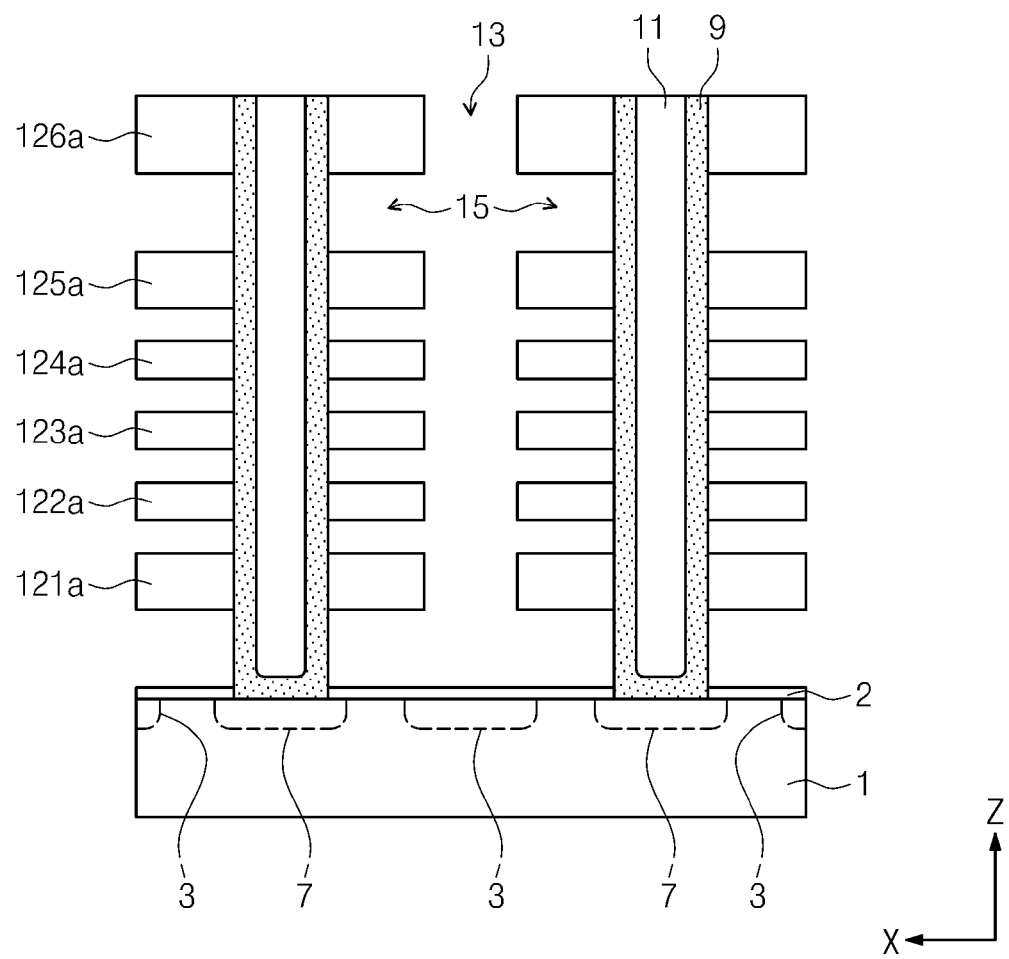

Referring to FIG. 6C, the sacrificial layer patterns 111a-116a exposed by the second opening 13 are selectively removed. As an example, the removing of the sacrificial layer patterns 111a-116a may be performed using an etch gas or etchant that can selectively remove only the sacrificial layer patterns 111a-116a, without etching the intergate dielectric patterns 121a-126a and the semiconductor layer 1. As the sacrificial layer patterns 111a-116a are removed, a gate formation region 15 is formed at portions where the sacrificial layer patterns 111a-116a were positioned. In the gate formation region 15, a sidewall of the active pillar 9, top and bottom surfaces of the intergate dielectric patterns 121a-126a and a top surface of the etch stop layer 2 are exposed.

Figure 6D:
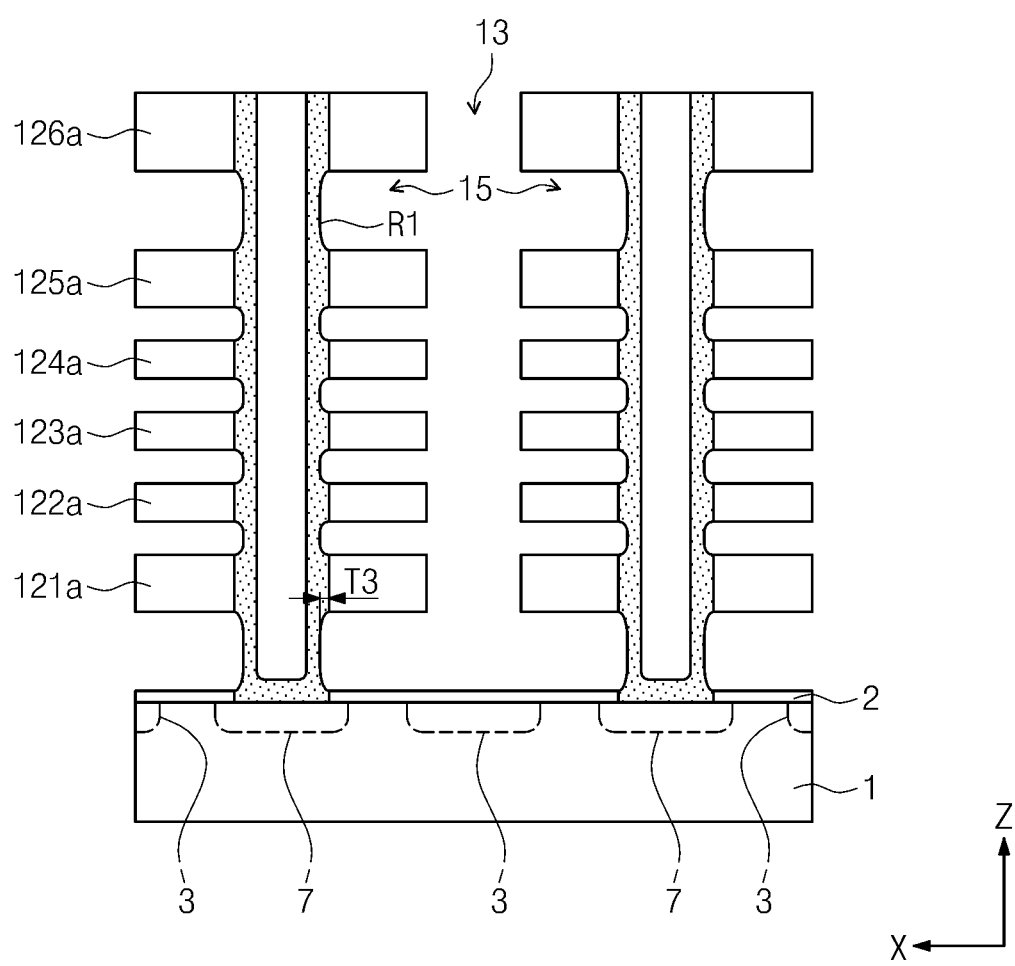

Referring to FIG. 6D, portions of the sidewalls of the active pillar 9 exposed by the gate formation region 15 are removed to a third lateral thickness T3 using an isotropic etch process to form recessed regions R1. Since the etch stop layer 2 is positioned on the semiconductor layer 1, although the semiconductor layer 1 is formed of single crystalline silicon, the semiconductor layer 1 is not etched by the isotropic etch process, due to the presence of the etch stop layer 2. The isotropic etch process results in the recessed regions R having a rounded surface, as shown in FIG. 6D. As a result of the isotropic etch process, the active pillar 9 becomes a recessed active pillar 9a, having sidewalls with an irregular outer sidewall surface. The outer sidewall surface is irregular in the sense that it has indentations, or recesses, in the outer sidewall, as described above.

Thereafter, using the same process as the first embodiment described above, an information storage layer 20, gate patterns 25S, 25W, and 25G, a buried insulation pattern 27, a third impurity implantation region 28 and conductive lines 30 are formed, so as to complete the semiconductor device having the structure of FIG. 5.

Any processes or structures which are not described in detail above in connection with the present embodiment, can be the same as those described in connection with the first embodiment.

<Embodiment 3>

Figure 7:
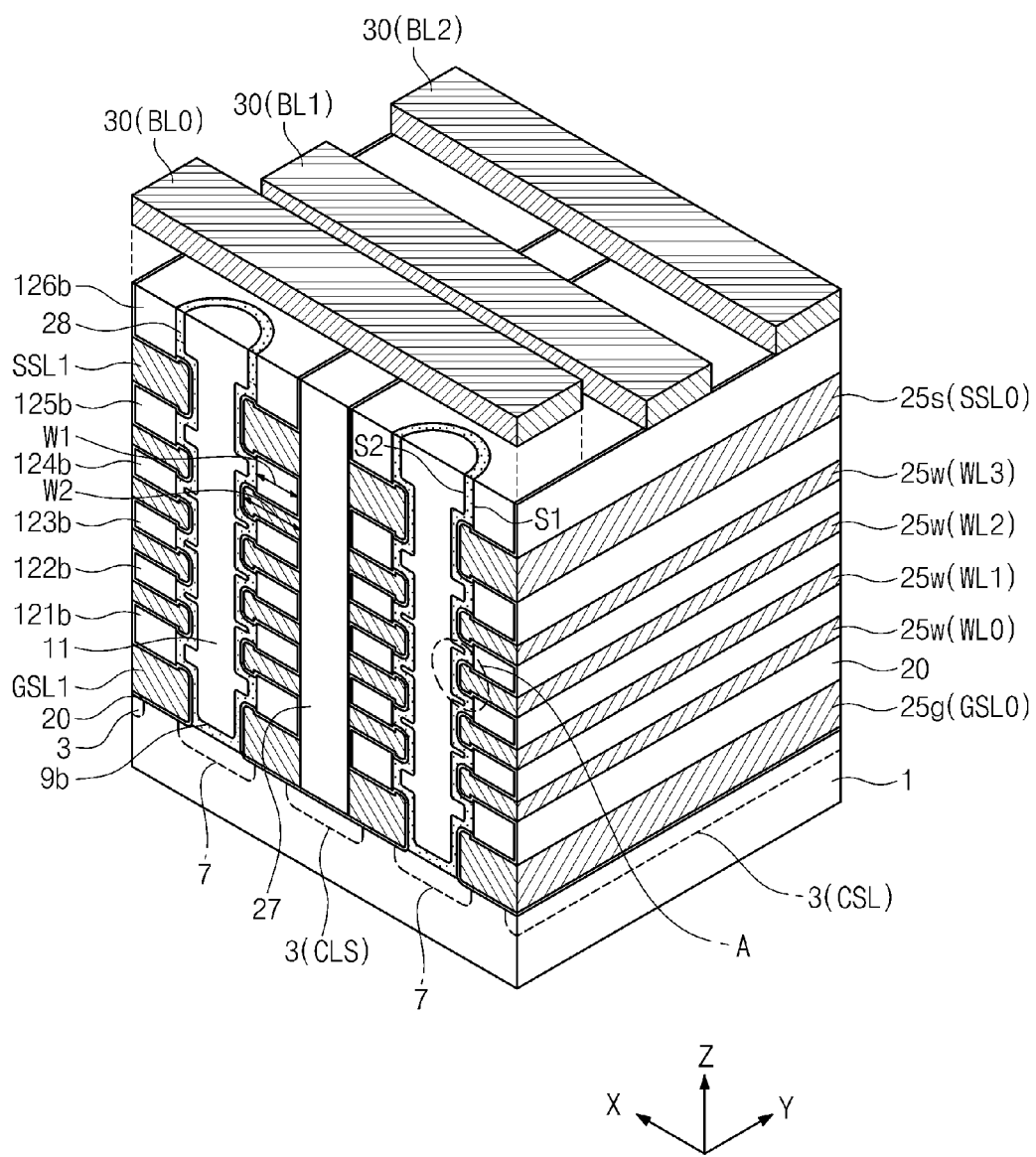
FIG. 7 is a perspective view of a vertical type semiconductor device according to a third embodiment of the inventive concept.
Figure 8:
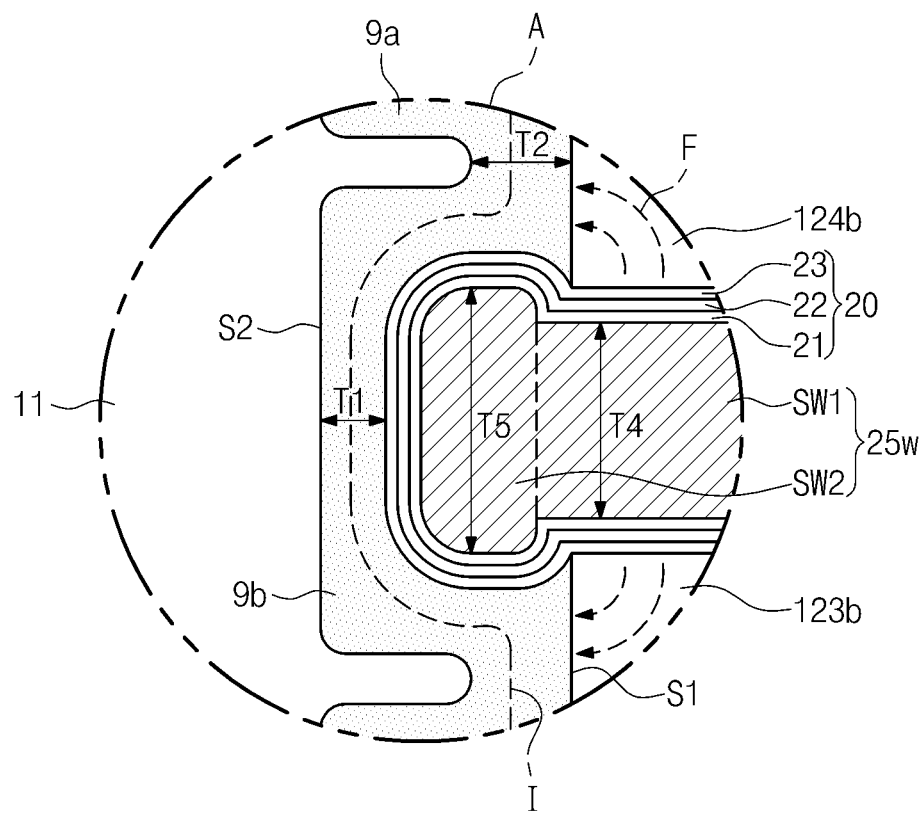
FIG. 8 is a detailed view of portion A of FIG. 7.

FIG. 7 is a perspective view of a vertical type semiconductor device according to a third embodiment of the present inventive concept and FIG. 8 is a detailed view of portion A of FIG. 7.

Referring to FIGS. 7 and 8, in a vertical type semiconductor device according to this embodiment, an active pillar 9b has an outer sidewall S1 in contact with the information storage layer 20, and an inner sidewall S2 in contact with the inner insulation pattern 11, and both of the outer and inner sidewalls have an irregular structure. In this case, the inner and outer sidewalls S1, S2 are irregular in the sense that neither sidewall is linear, but rather, both sidewalls are serpentine or meandering in shape. A first portion of the active pillar 9b adjacent to an inner sidewall of the gate patterns 25g, 25w, 25s has a first thickness T1 in the first horizontal direction X, and second portion of the active pillar 9b adjacent to an inner sidewall of the intergate dielectric patterns 121b-126b has a second thickness T2 in the first horizontal direction X. In one embodiment, the first thickness T1 is less than the second thickness T2. In addition, the intergate dielectric patterns 121b-126b have a first width W1 in the first horizontal direction X, and the gate patterns 25g, 25w, 25s have a second width W2 in the first horizontal direction X and a difference between the first width W1 and the second width W2 is greater than the difference between these widths in the first embodiment. Each of the gate patterns 25g, 25w, 25s may include a first sub-gate pattern SW1 and a second sub-gate pattern SW2 that are connected with each other, for example, integral with each other. The first sub-gate pattern SW1 is positioned between neighboring intergate dielectric patterns 121b-126b so that the intergate dielectric patterns 121b-126b vertically overlap the first sub-gate pattern SW1, and the first sub-gate pattern SW1 has a fourth thickness T4 in a third direction Z that is a vertical direction. The second sub-gate pattern SW2 is positioned between portions of the active pillar 9b adjacent to the intergate dielectric patterns 121b-126b so that it overlaps the active pillar 9b in a vertical direction, and the second sub-gate pattern SW2 has a fifth thickness T5 in the third vertical direction Z. In one embodiment, the fifth thickness T5 is greater than the fourth thickness T4 so that the second sub-gate pattern SW2 is bulbous in shape relative to the first sub-gate pattern SW1.

Since the outer sidewall S1 of the active pillar 9b has the irregular structure of a meandering or serpentine shape, a distance from a point on the outer sidewall S1 of the active pillar 9b to a point on an upper or lower surface of one of the gate patterns 25g, 25w, 25s is relatively closer in the present configuration due to the presence of the recess, as compared to a configuration in which the gate pattern 25g, 25w, 25s does not protrude into the outer sidewall of the active pillar. As a result, when a voltage is applied to the gate patterns 25g, 25w, 25s, the influence of a resulting fringe field F on the active pillar 9b can be relatively increased in the present configuration. Thus, an inversion region I may be more readily formed in the outer sidewall S1 of the active pillar 9a. As a result, the amount of ON current in the channel region is increased, so that sensing margin of the resulting device can be increased. Also, in the present configuration, as the first thickness T1 of the active pillar 9b, which will become a channel region, is made relatively thinner, the possibility of a boundary existing between grains of polysilicon is decreased. In one embodiment, the first thickness T1 is less than an average size of the polysilicon grain size. Accordingly, as the first thickness T1 is decreased, the resulting probability that charge can be trapped in the grains of polysilicon is also decreased. That is, the trap density in the channel region is decreased. As a result, variation in the threshold voltages of transistors including the gate patterns 25s, 25w, 25g is likewise decreased. Meanwhile, the sidewall portion of the active pillar 9b, which is adjacent to the intergate dielectric patterns 121a, 122a, 123a, 124a, 125a, 126a and corresponds to a source/drain region for the resulting device, has the second thickness T2. Since the second thickness T2 is relatively greater than the first thickness T1, a sectional area of the sidewall portion of the active pillar 9b, which is adjacent to the intergate dielectric patterns 121a, 122a, 123a, 124a, 125a, 126a, is increased. Therefore, when charge moves through this sidewall portion of the second thickness T2, electrical resistance is decreased. Accordingly, when the semiconductor device is operated, the transmission rate of electrical signals can be increased. Further, since the contact area between the active pillar 9b and the information storage layer 20 is increased as a result of the active pillar surrounding a portion of the second sub-gate pattern SW2, the effective channel length is increased and thus limitations due to the short channel effect can be mitigated. Also, a contact boundary surface between the active pillar 9b and the information storage layer 20 is rounded with minimal to no angled portions. As a result, electric field is not concentrated on one position, but is instead dispersed; thus, degeneration of the information storage layer 20 over time can be prevented. As a result, reliability of the resulting vertical type semiconductor memory device can be enhanced.

Any processes or structures which are not described in detail above in connection with the present embodiment, can be the same as those described in connection with the first or second embodiments, or as other embodiments described herein.

FIGS. 9A through 9F are cross-sectional views in the X-Z plane of FIG. 7 sequentially illustrating a method for fabricating a semiconductor device.

Figure 9A:
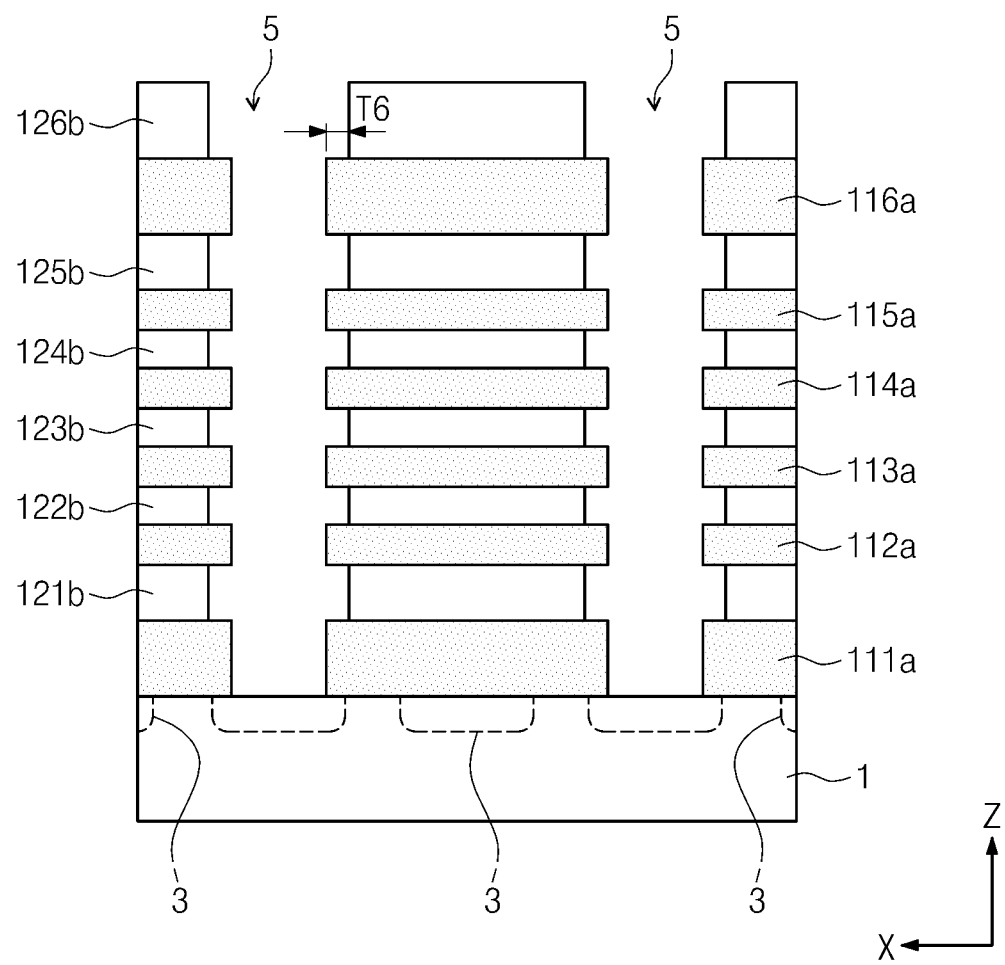
FIGS. 9A through 9F are cross-sectional views in the X-Z plane of FIG. 7 sequentially illustrating a method for fabricating a semiconductor device.

Referring to FIG. 9A, the processes described above in connection with the first embodiment of FIGS. 4A and 4B are performed. Next, sidewall portions of the intergate dielectric patterns (see 121a-126a of FIG. 4B) exposed by the cup-shaped first opening 5 are removed to a sixth thickness T6, as shown in FIG. 9A. In doing so, top surfaces and bottom surfaces of the sacrificial layer patterns 111a-116a are partially exposed. In addition, the intergate dielectric patterns (see 121a-126a of FIG. 4B) may become intergate dielectric patterns 121b-126b having relatively reduced widths. The inner sidewall of the first opening 5 has an irregular structure as a result, in this sense it is not linear, but rather meanders.

Figure 9B:
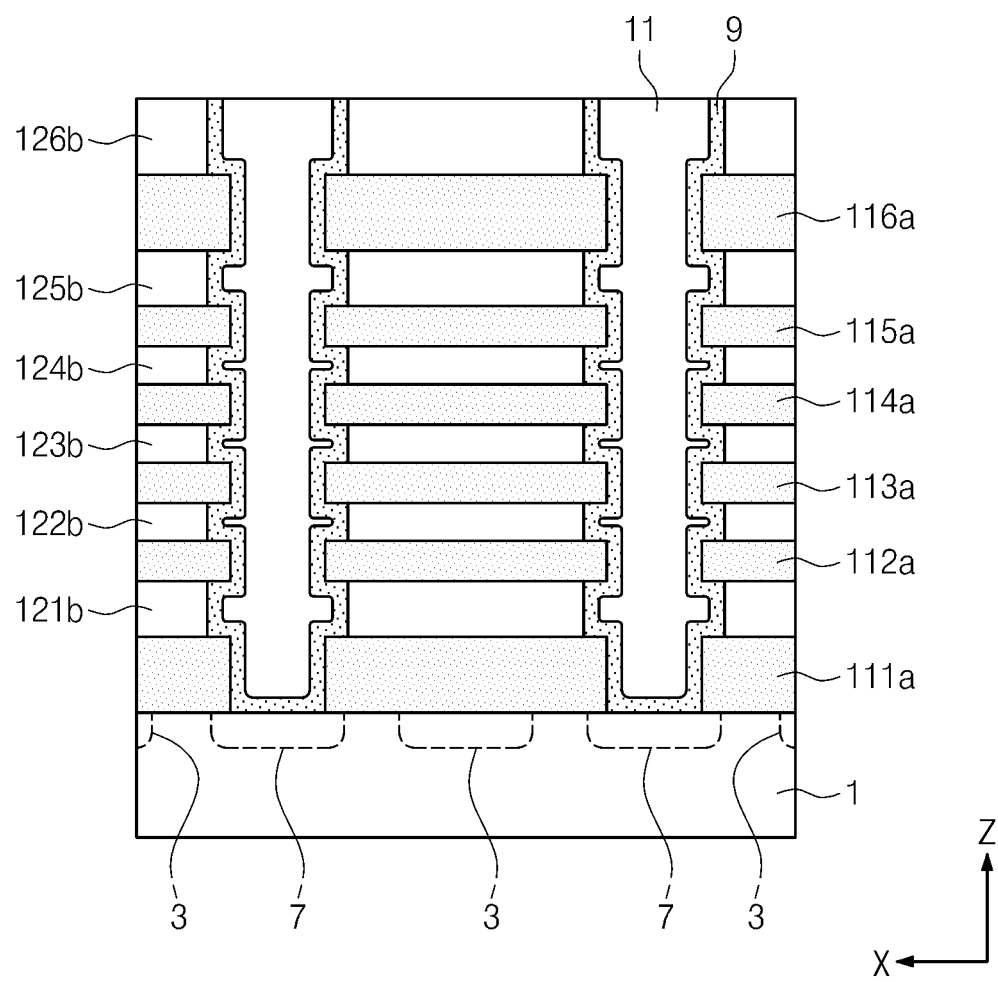

Referring to FIG. 9B, an active pillar layer is conformally formed on an entire inner surface of the opening, including an upper surface of the semiconductor layer 1 and exposed surfaces of the sacrificial layer patterns 111a-116a of which top surfaces and bottom surfaces are partially exposed. Since an inner sidewall of the first opening 5 has an irregular structure, the resulting active pillar 9 is also formed to be an irregular shape, having inner and outer sidewalls S2, S1 of an irregular shape. The interior of the active pillar 9 is filled with an inner insulation layer, and a planarizing process is performed to result in formation of the active pillar 9 and the inner insulation pattern 11.

Figure 9C:
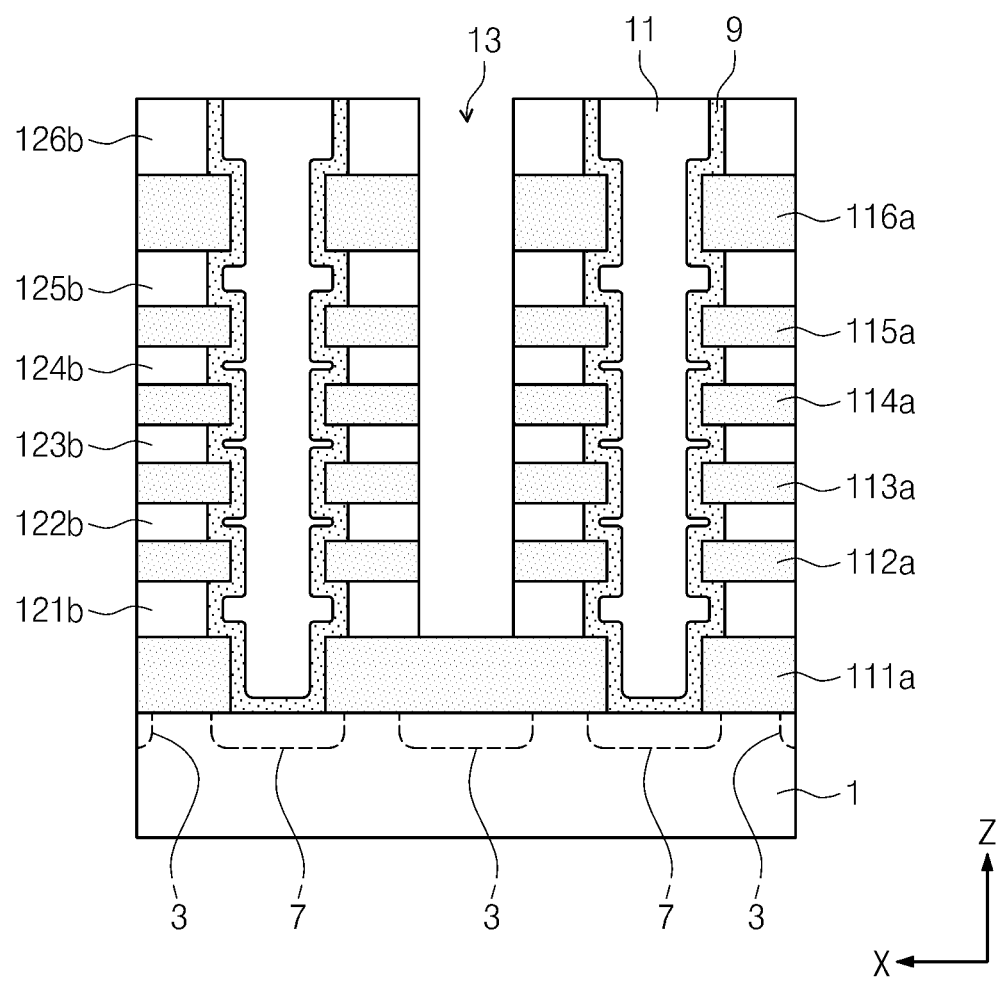

Referring to FIG. 9C, a second opening 13 is then formed by patterning and removing portions of the intergate dielectric patterns 121a-126a and the sacrificial layer patterns 112a-116a positioned over or overlapping the a first impurity implantation region 3 of the semiconductor layer 1 between neighboring ones of the active pillars 9.

Figure 9D:
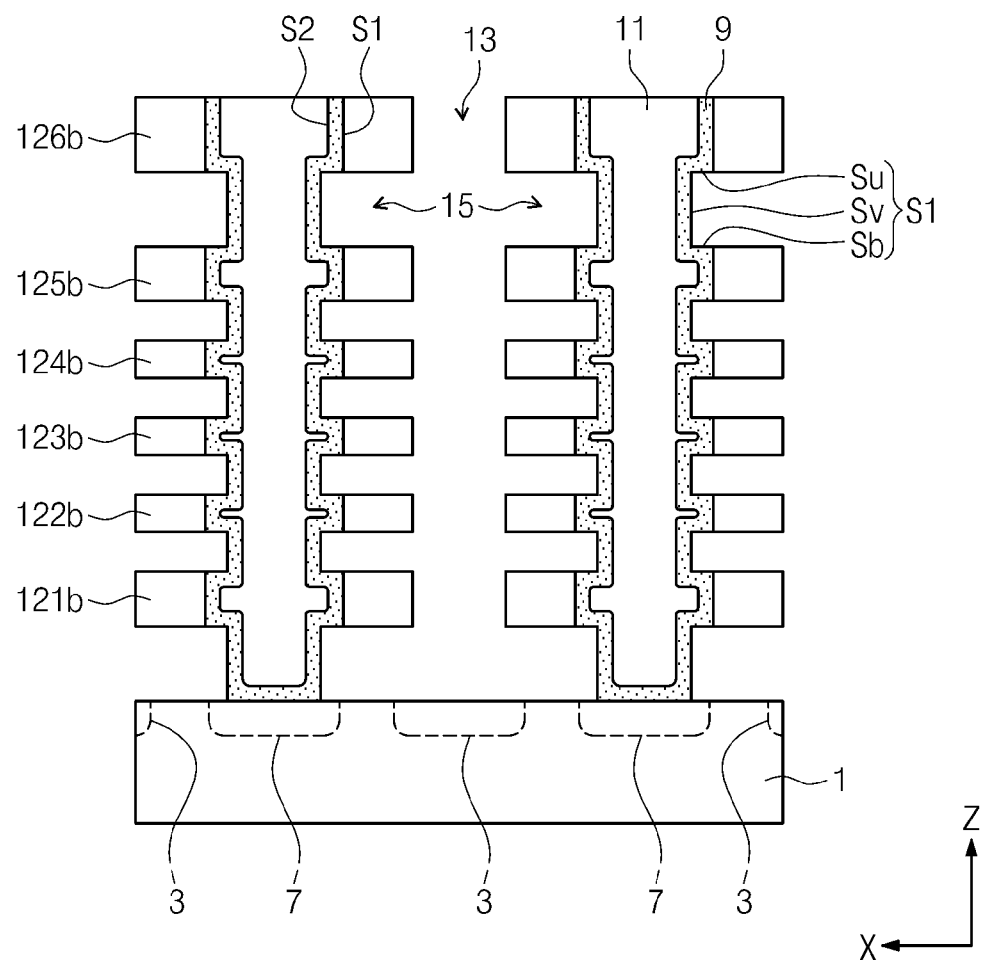

Referring to FIG. 9D, the sacrificial layer patterns 111a-116a exposed by the second opening 13 are selectively removed. In doing so, outer sidewalls of the active pillars 9 and a top surface of the semiconductor layer 1 are exposed. Assuming that the portions where the sacrificial layer patterns 111a-116a were positioned are gate formation regions 15 at which gates are to be formed, a cross section of an outer sidewall of the active pillar 9 exposed by the gate formation regions 15 has a concave, angled, '⊏' shape. That is, the outer sidewall S1 of the active pillar 9 exposed by one of the gate formation regions 15 may include a vertical surface 'sv' parallel to a third direction Z that is a vertical direction, an upper surface 'su', which is normal to the vertical surface 'sv' and extending in the first horizontal direction X and positioned at an upper side of the gate formation region 15, and a lower surface 'sb', which is normal to the vertical surface 'sv' and extending in the first horizontal direction X and positioned at a lower side of the gate formation region 15.

Figure 9E:
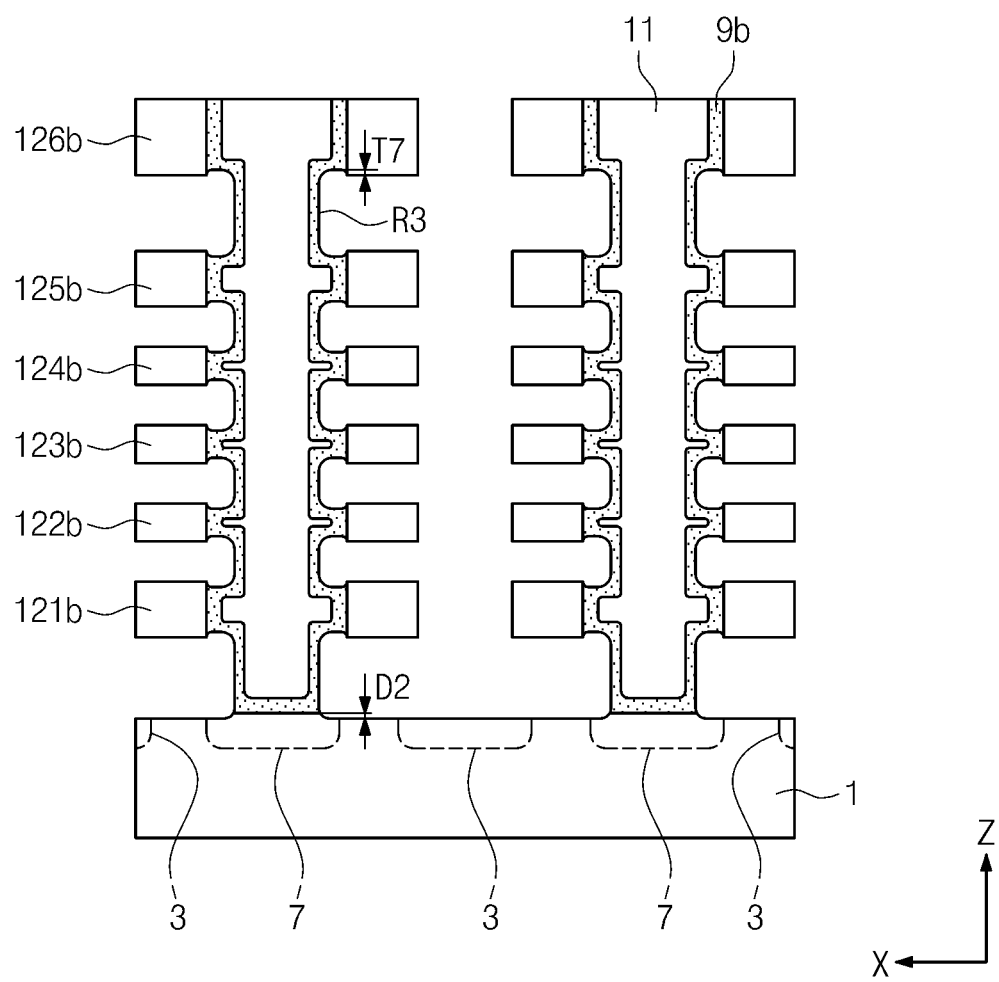

Referring to FIG. 9E, an isotropic etch process is performed to remove an exposed portion of the outer sidewall S1 of the active pillar 9 by a seventh thickness T7. At this time, since the outer sidewall S1 exposed by the gate formation region 15 originally has the '⊏' shape, the upper surface 'su' and the lower surface 'sb' as well as the vertical surface 'sv' are simultaneously removed to form a third recessed region R3. In the present embodiment, a vertical width of the third recessed region R3 is greater than a vertical spacing between neighboring intergate dielectric patterns 121b-126b. Further, the isotropic etch process results in the third recessed region R3 of the active pillar 9b having a rounded sidewall profile. The top surface of the semiconductor layer 1 exposed by the isotropic etch process may be also become recessed by a second depth D2. The second depth D2 may be equal to or smaller than the seventh thickness T7.

Figure 9F:
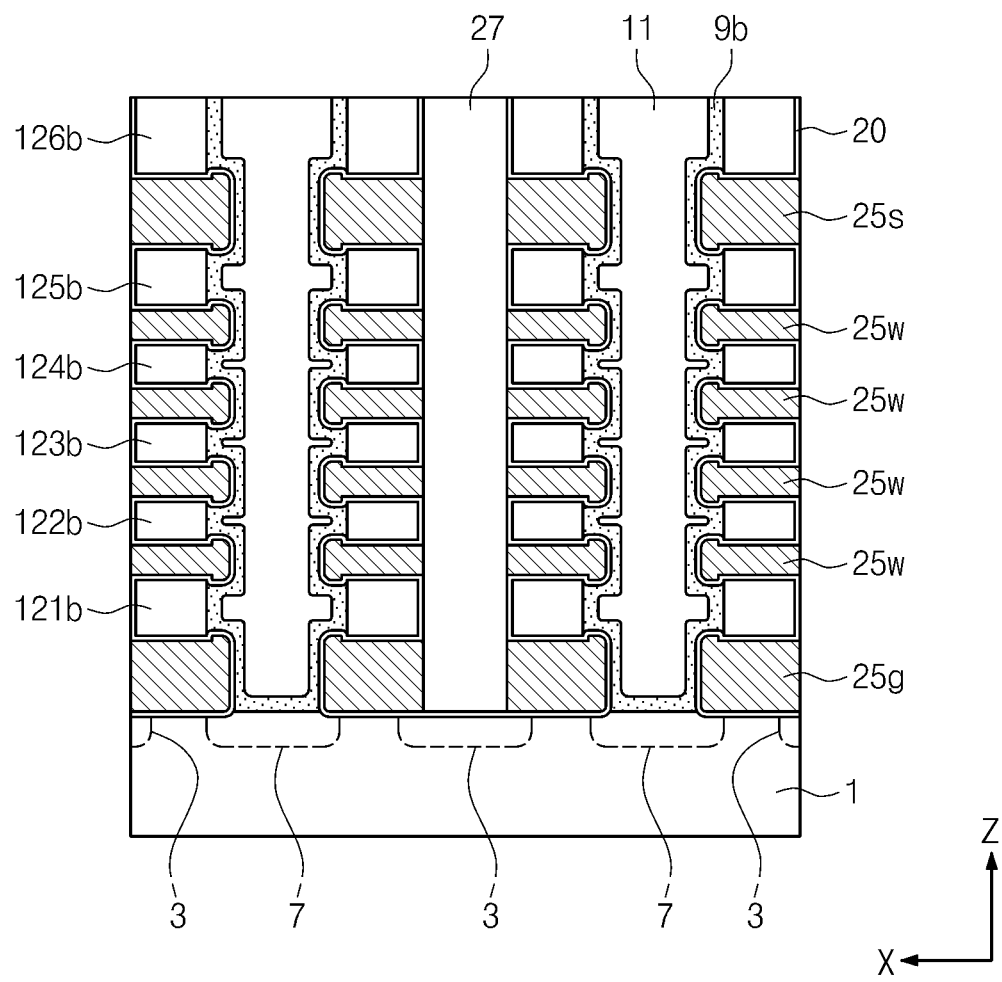

Referring to FIG. 9F, an information storage layer 20, gate patterns 25g, 25w, 25s and a buried insulation pattern 27 are formed in the same manner as the first embodiment, for example, as described above in connection with FIGS. 4G-4H. The resulting shapes of the information storage layer 20 and the gate patterns 25g, 25w, 25s are influenced by the profile of the third recessed region R3.

Thereafter, a third impurity implantation region 28 and a conductive line 30 may be formed to provide a semiconductor device having the structure of FIG. 7.

Any processes or structures which are not described in detail above in connection with the present embodiment, can be the same as those described in connection with the first embodiment, or with other embodiments disclosed herein.

<Embodiment 4>

Figure 10:
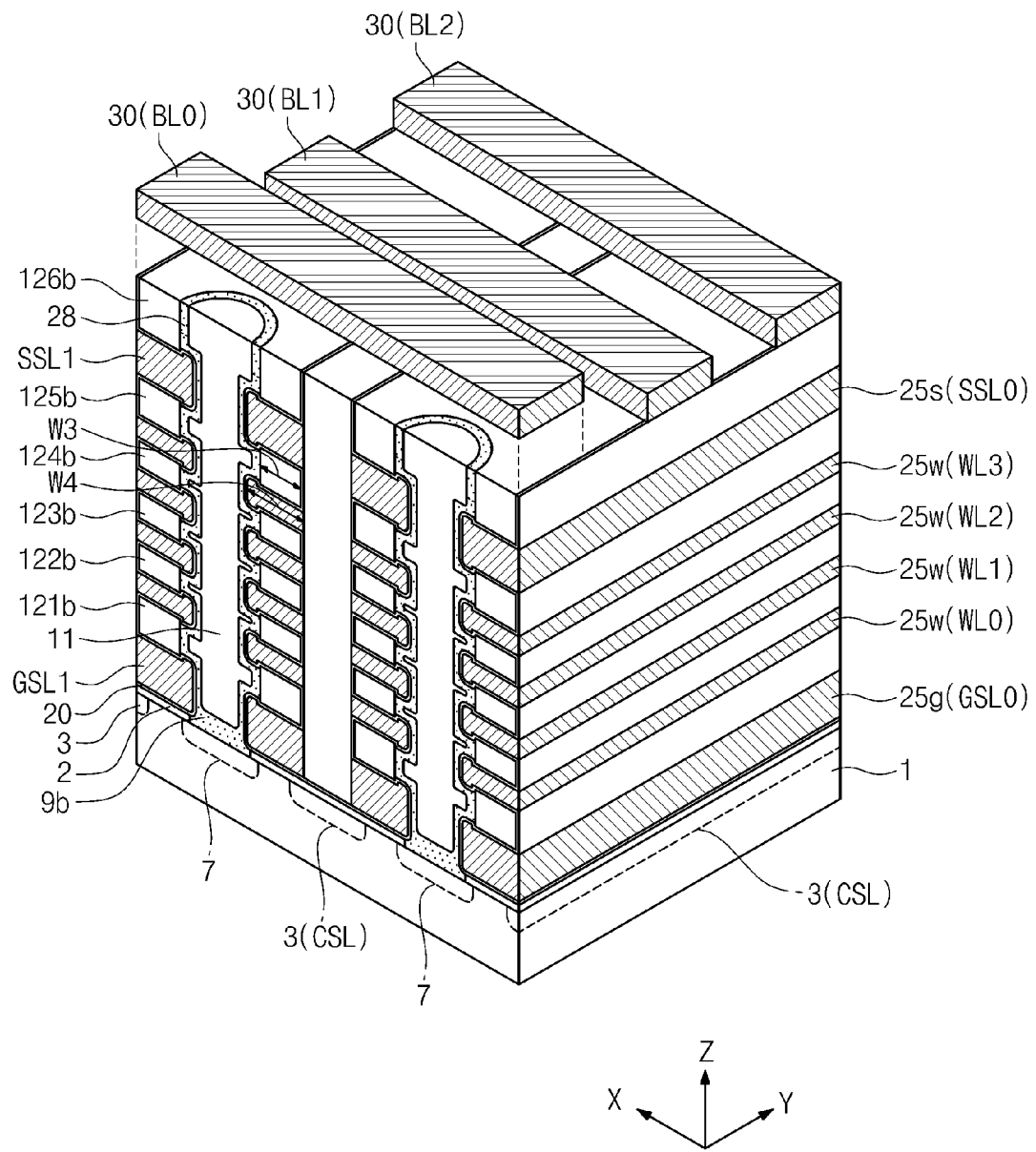
FIG. 10 is a perspective view of a vertical type semiconductor device according to a fourth embodiment of the inventive concept.

FIG. 10 is a perspective view of a vertical type semiconductor device according to a fourth embodiment of the present inventive concept.

Referring to FIG. 10, a semiconductor device according to the present embodiment is similar in many respects to the device of the third embodiment described above in connection with FIG. 7. An exception lies in that in the present fourth embodiment, an etch stop layer 2 is positioned between the information storage layer 20 below the ground select gate pattern 25g and the semiconductor layer 1. The etch stop layer 2 can be formed, for example, of a material having an etch selectivity with respect to the semiconductor layer 1, the sacrificial layers 111-116, the active pillar 9b and the intergate dielectric patterns 121b-126b which are to formed during subsequent process steps. Therefore, when the sidewalls of the intergate dielectric patterns (see 121b-126b of FIG. 9A) are partially removed as shown in FIG. 9A, the etch stop layer 2 is not removed but instead remains. Alternatively, in a case where the etch stop layer 2 and the intergate dielectric patterns (see 121b-126b of FIG. 9A) are formed of the same material, when the sidewalls of the intergate dielectric patterns (see 121b-126b of FIG. 9A) are partially removed as shown in FIG. 9A, the etch stop layer 2 should be formed to a thickness that takes into consideration that an upper portion of the etch stop layer 2 will be partially removed. The active pillar 9b penetrates the etch stop layer 2 to contact the semiconductor layer 1. In this embodiment, a top surface of the semiconductor layer 1 is not recessed, due to the presence of the etch stop layer 2.

<Embodiment 5>

Figure 11:
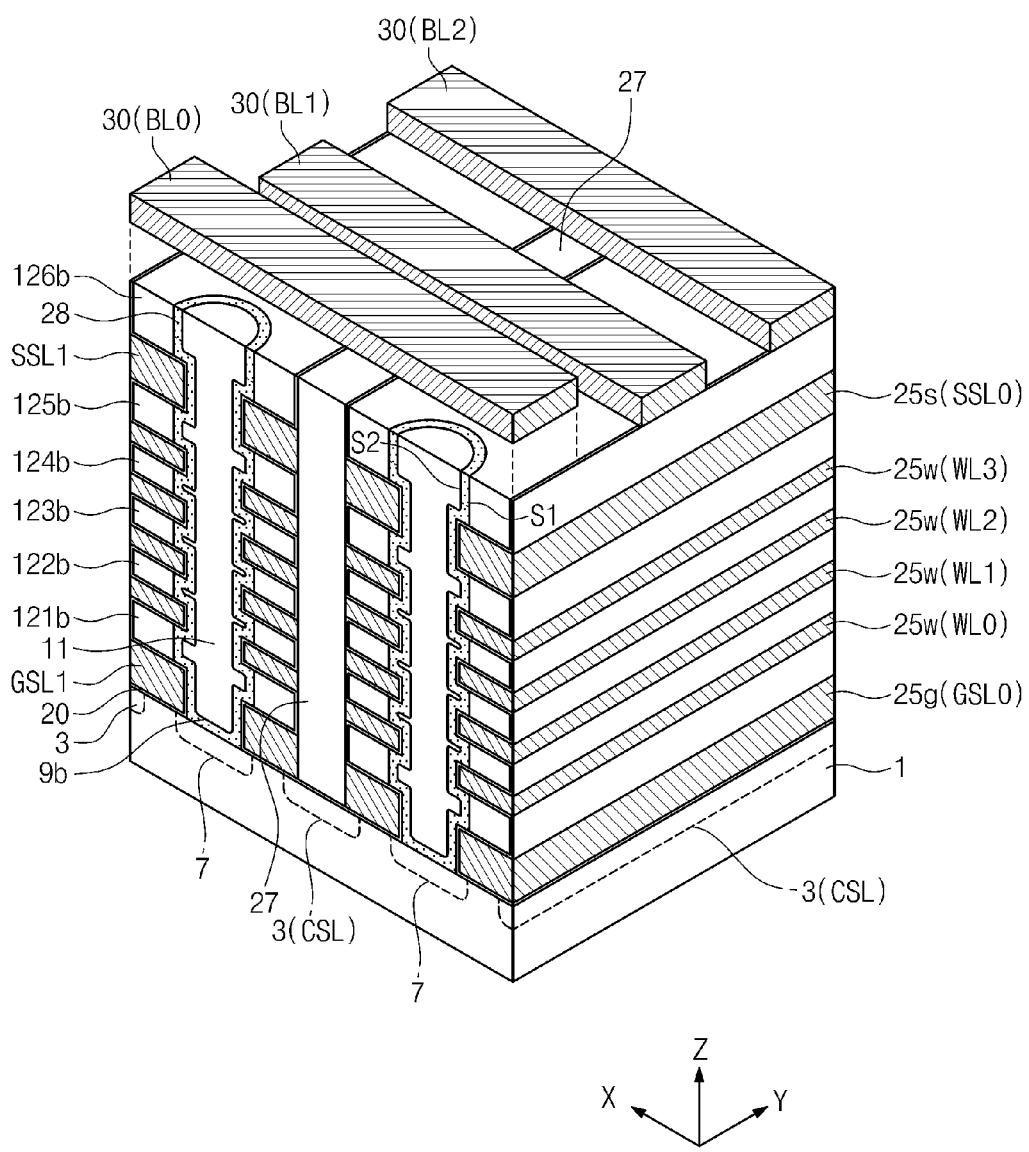
FIG. 11 is a perspective view of a vertical type semiconductor device according to a fifth embodiment of the inventive concept.

FIG. 11 is a perspective view of a vertical type semiconductor device according to a fifth embodiment of the present inventive concept.

Referring to FIG. 11, a semiconductor device according to the present embodiment is similar in many respects to the device of the third embodiment described above in connection with FIG. 7. An exception lies in that in the present fifth embodiment, the outer sidewall S1 does not include a rounded and recessed region as in the first, second, third and fourth embodiments. Instead, in the present embodiment, the active pillar 9b is conformally formed to have substantially the same thickness throughout its length. In the present embodiment, an information storage layer 20, gate patterns 25g, 25w, 25s and a buried insulation 27 are formed without having performed for an isotropic etch process, as shown and described above in connection with FIG. 9D, in order to partially recess the outer sidewalls S1 of the active pillar 9b. Instead, by not performing this additional isotropic etch process, the outer sidewalls S1 of the active pillar 9b do not become recessed in this embodiment.

<Embodiment 6>

Figure 12:
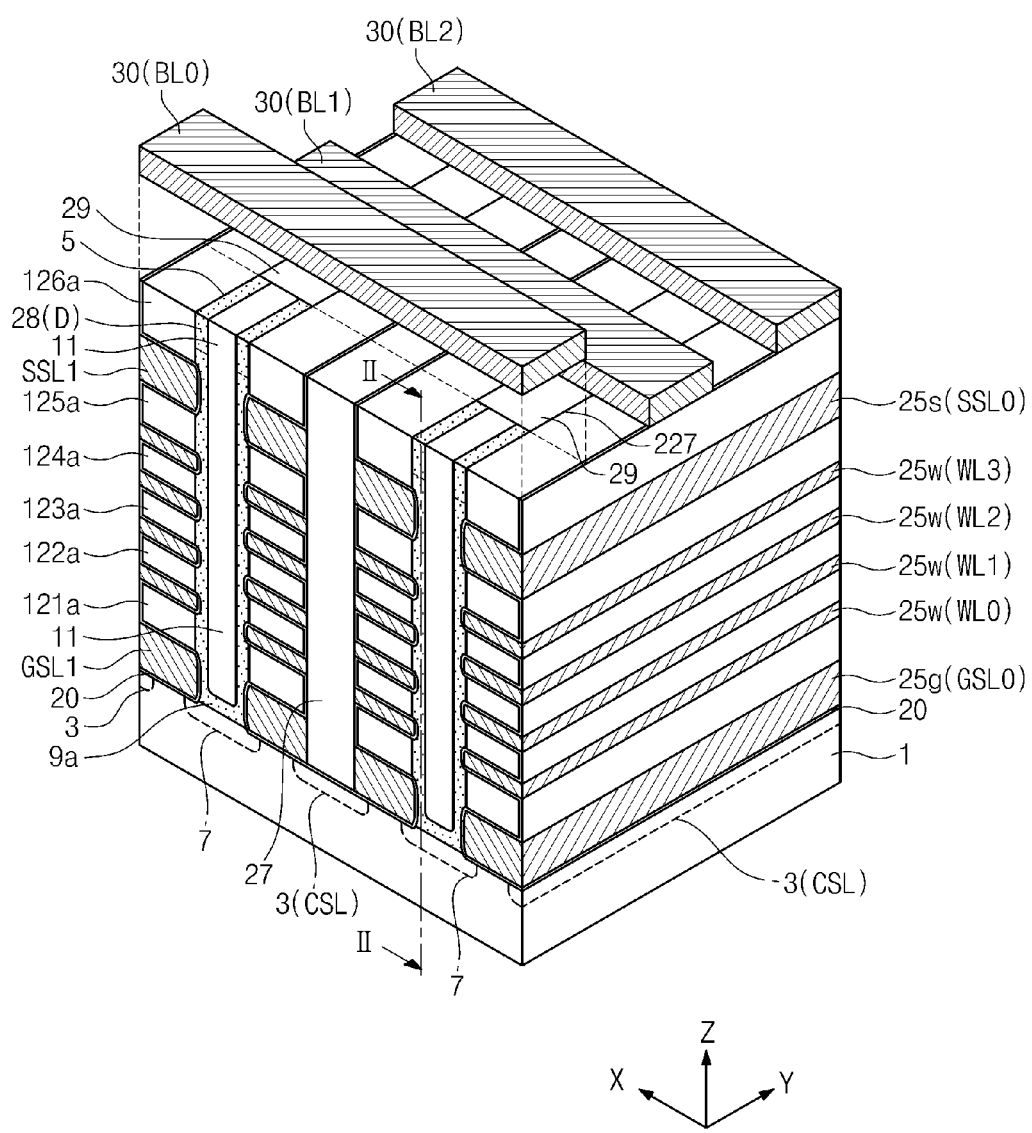
FIG. 12 is a perspective view of a vertical type semiconductor device according to a sixth embodiment of the inventive concept.
Figure 13:
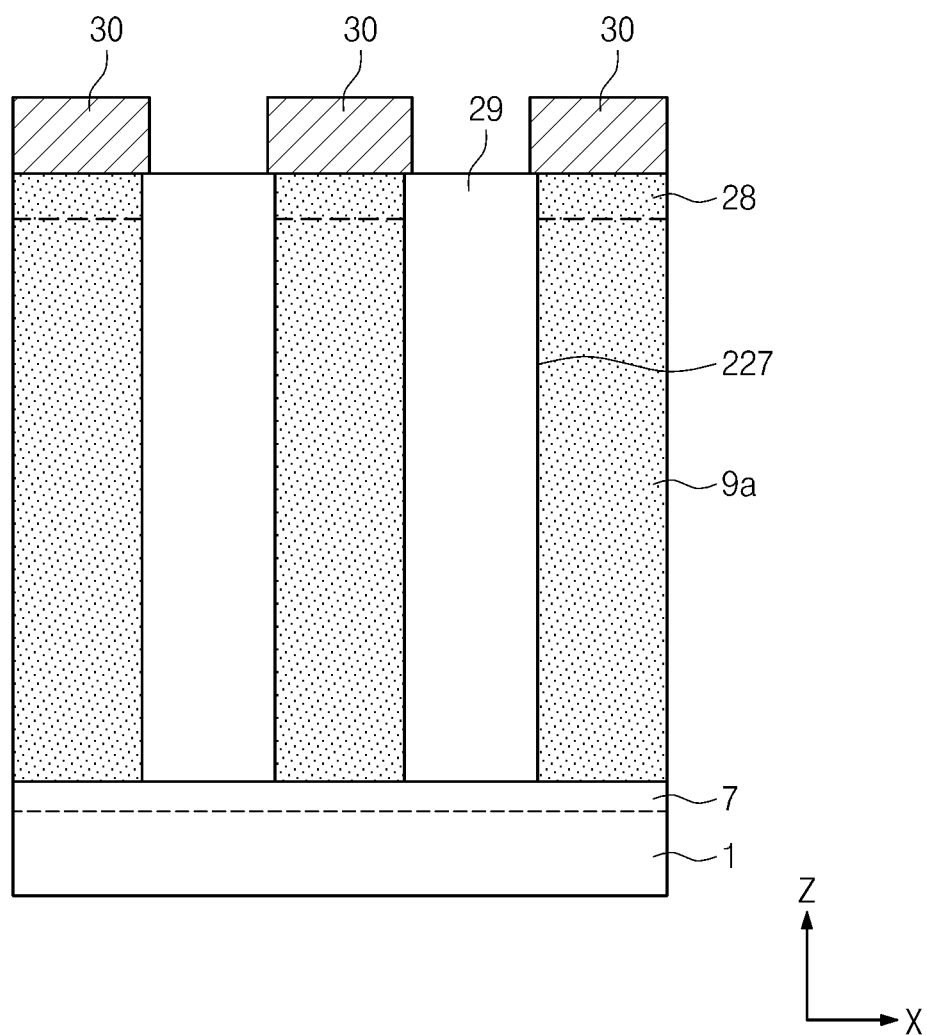
FIG. 13 is a cross-sectional view taken along line II-II of FIG. 12.

FIG. 12 is a perspective view of a vertical type semiconductor device according to a sixth embodiment of the inventive concept. FIG. 13 is a cross-sectional view cross-sectional views in the X-Z plane of FIG. 12 taken along line II-II of FIG. 12 illustrating a method for fabricating a semiconductor device.

Referring to FIGS. 12 and 13, a semiconductor device according to the present embodiment is similar in many respects to the device of the first embodiment described above in connection with FIG. 2. An exception lies in that in the present sixth embodiment, the active pillar 9b not formed in a cup shape, or noodle shape, having a circular or oval cross section in the X-Y horizontal plane as shown in FIG. 2. Instead, in the present sixth embodiment, the active pillar 9a comprises first and second linear opposed plates that are connected at a bottom section where they meet with the semiconductor layer. The opposed plates extend in the second horizontal direction Y as shown in FIGS. 12 and 13. Active pillars 9a that neighbor each other in the second horizontal direction Y are separated from each other by a separation insulation pattern 29 that is disposed in a separation hole 227 between the neighboring active pillars 9a. The separation hole 227 further operates to separate portions of the gate patterns 25g, 25w, 25s so that the gate patterns 25g, 25w, 25s of a common plane are separated from each other in the first horizontal direction X and run in lines in the second horizontal direction Y. As in the above embodiments, an inside of the active pillar 9a is filled with an inner insulation pattern 11. In the present embodiment, the inner sidewall of the active pillar 9a is linear in the sense that it is generally straight in shape in the vertical direction Z of extension. In a semiconductor device according to the present embodiment, two or more cell strings can share one common active pillar 9a with each other. A first cell string can correspond with a first leg of the pillar 9a, while a second cell string can correspond with a second leg of the pillar 9a. Accordingly, the level of integration can be increased as compared with the configurations of the first through fifth embodiments above. The present embodiment whereby the active pillars can comprise opposed plates can be applied to any of the first through fifth embodiments, and to other embodiments, disclosed herein.

Any processes or structures which are not described in detail above in connection with the present embodiment, can be the same as those described in connection with the first embodiment, or with other embodiments disclosed herein.

<Embodiment 7>

Figure 14:
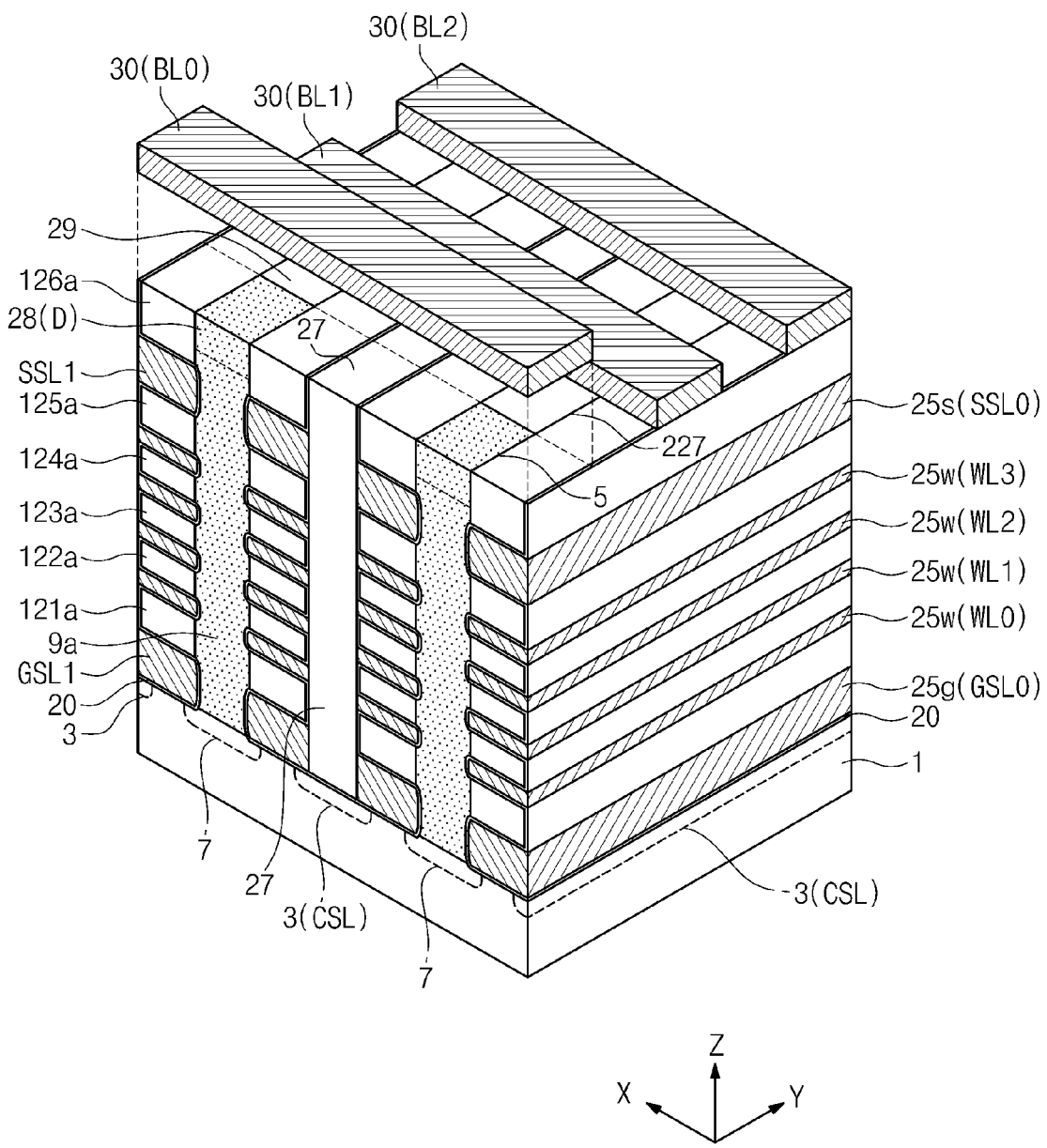
FIG. 14 is a perspective view of a vertical type semiconductor device according to a seventh embodiment of the inventive concept.

FIG. 14 is a perspective view of a vertical type semiconductor device according to a seventh embodiment of the inventive concept.

Referring to FIG. 14, a semiconductor device according to the present embodiment is similar in many respects to the device of the first through fifth embodiments described above in connection with FIGS. 2-11 and to the device of the sixth embodiment described above in connection with FIGS. 12 and 13. An exception lies in that in the present seventh embodiment, the active pillar 9b not formed in a cup shape, or noodle shape, having a circular or oval cross section in the X-Y horizontal plane as shown in FIGS. 2-11, nor is the active pillar 9a formed to include first and second linear opposed plates that are connected at a bottom section where they meet with the semiconductor layer as shown in FIGS. 12 and 13. Instead, in the present seventh embodiment, the active pillar 9a is formed to fill the first opening 5, and the inner insulation pattern 11 shown in FIG. 12 does not exist. In the case of this embodiment, as in the sixth embodiment, active pillars 9a that neighbor each other in the second horizontal direction Y are separated from each other by a separation insulation pattern 29 that is disposed in a separation hole 227 between the neighboring active pillars 9a. The separation hole 227 further operates to separate portions of the gate patterns 25g, 25w, 25s so that the gate patterns 25g, 25w, 25s of a common plane are separated from each other in the first horizontal direction X and run in lines in the second horizontal direction Y. In a semiconductor device according to the present embodiment, two or more cell strings can share one common active pillar 9a with each other. A first cell string can correspond with a first outer sidewall of the pillar 9a, while a second cell string can correspond with a second outer sidewall of the pillar 9a opposite the first outer sidewall. Accordingly, the level of integration can be increased as compared with the configurations of the first through fifth embodiments above. The present embodiment whereby the active pillars can comprise a solid configuration can be applied to any of the first through fifth embodiments, and to other embodiments, disclosed herein.

Any processes or structures which are not described in detail above in connection with the present embodiment, can be the same as those described in connection with the first embodiment or with other embodiments disclosed herein.

<Embodiment 8>

Figure 15:
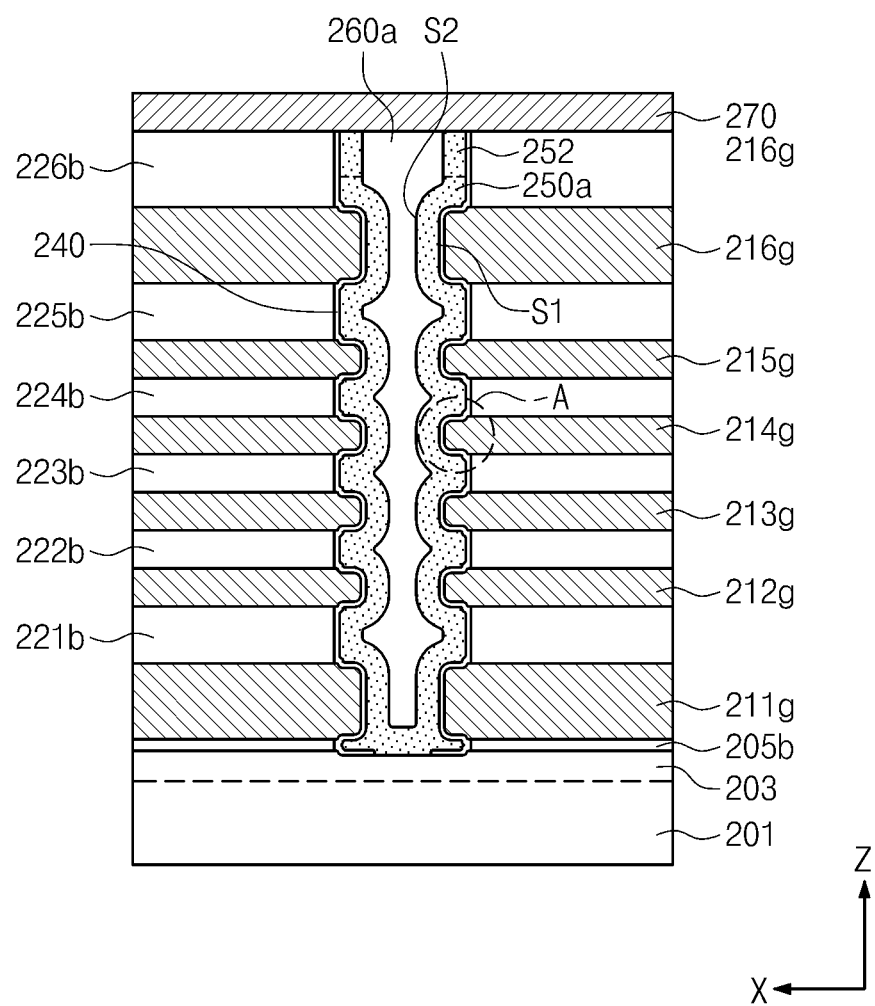
FIG. 15 is a cross-sectional view of a vertical type semiconductor device according to a eighth embodiment of the inventive concept.
Figure 16:
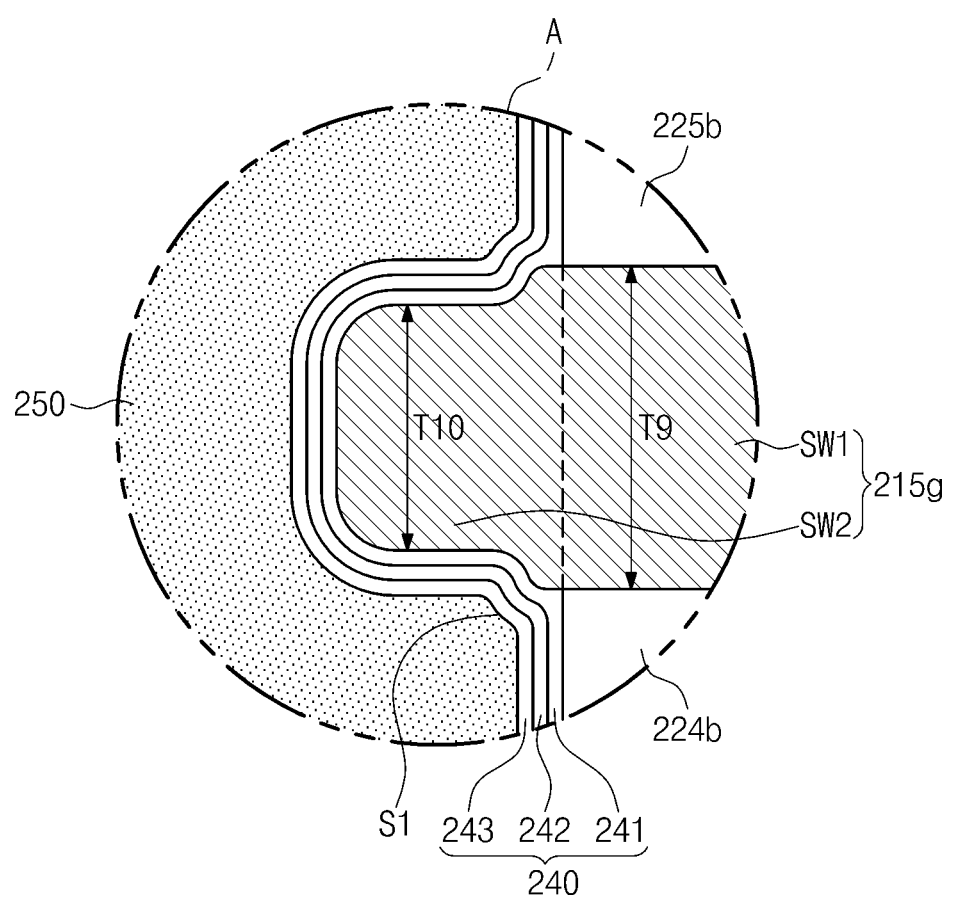
FIG. 16 is a detailed view of portion A of FIG. 15.

FIG. 15 is a cross-sectional view of a vertical type semiconductor device according to an eighth embodiment of the inventive concept. FIG. 16 is a detailed view of portion A of FIG. 15.

Referring to FIGS. 15 and 16, in a semiconductor device according to this embodiment, a buffer layer 205b is positioned on a semiconductor layer 201. A first impurity implantation region 203 functioning as a common source region is disposed in the semiconductor layer 201. Gate patterns 211g-216g and intergate dielectric patterns 221b-226b are alternatingly stacked on the buffer layer 205b. The gate patterns 211g-216g can comprise, for example, impurity-doped polysilicon layers. An active pillar 250a is provided that penetrates the intergate dielectric patterns 221b-226b, the gate patterns 211g-216g, and the buffer layer 205b to contact the semiconductor layer 201. The active pillar 250a may have a cup shape, or macaroni shell shape. An interior of the active pillar 250a can be filled with an inner dielectric pattern 260a. An information storage layer 240 is disposed between the active pillar 250a and inner side surfaces of the gate patterns 211g-216g. The active pillar 250a has an outer sidewall in contact with the information storage layer 240, and an inner sidewall in contact with the inner dielectric pattern 260a. Both of the outer sidewall S1 and the inner sidewall S2 have an irregular structure, in the sense that neither is linear, but instead both have a meandering, or serpentine, shape. Spacing between the outer sidewall S1 and the inner sidewall S2 is nearly constant throughout its length. The gate patterns 211g-216g may include a first sub-gate pattern SW1 and a second sub-gate pattern SW2 that are connected with each other, for example, integral with each other.

The first sub-gate pattern SW1 is positioned between neighboring intergate dielectric patterns 221b-226b so that the intergate dielectric patterns 221b-226b vertically overlap the first sub-gate pattern SW1, and the first sub-gate pattern SW1 has a ninth thickness T9 in a third direction Z that is a vertical direction. The second sub-gate pattern SW2 is positioned between portions of the active pillar 250a adjacent to the intergate dielectric patterns 221b-226b so that it overlaps the active pillar 250a in a vertical direction, and the second sub-gate pattern SW2 has a tenth thickness T10 in the third vertical direction Z. In one embodiment, the ninth thickness T9 is greater than the tenth thickness T10 so that the second sub-gate pattern SW2 is reduced in vertical cross-sectional size relative to the first sub-gate pattern SW1.

The information storage layer 240 may include a blocking dielectric 241 contacting the gate patterns 211g-216g, a tunnel dielectric 243 contacting the active pillar 250a, and a charge trapping layer disposed between the blocking dielectric 241 and the tunnel dielectric 243. In this embodiment, unlike the embodiments described above, the information storage layer 240 does not extend between the gate patterns 211g-216g and the intergate dielectric patterns 221b-226b. In addition, ends of the gate patterns 211g-216g, corresponding to ends of the second sub-gate patterns SW2 of the gate patterns 211g-216g, adjacent to the active pillar 250a do not have sharp-angled surfaces, but instead are rounded to have smooth contours. Also, the outer sidewall S1 of the active pillar 250a adjacent to the gate patterns 211g-216g is likewise not angled but instead is rounded. As a result, electric field is not concentrated on one position, but is instead dispersed; thus, degeneration of the information storage layer 20 over time can be prevented. As a result, reliability of the resulting vertical type semiconductor memory device can be enhanced.

A third impurity implantation region 252 functioning as a drain region is disposed at an upper portion of the active pillar 250a. A conductive line 270 contacting the third impurity implantation region 252 and extending in a first direction X to connect neighboring active pillars in the first horizontal direction X is disposed on the uppermost intergate dielectric pattern 226b.

FIGS. 17A through 17F are cross-sectional views sequentially illustrating a method for fabricating the semiconductor device of FIG. 15. FIG. 18 is a detailed view of portion A of FIG. 17D.

Figure 17A:
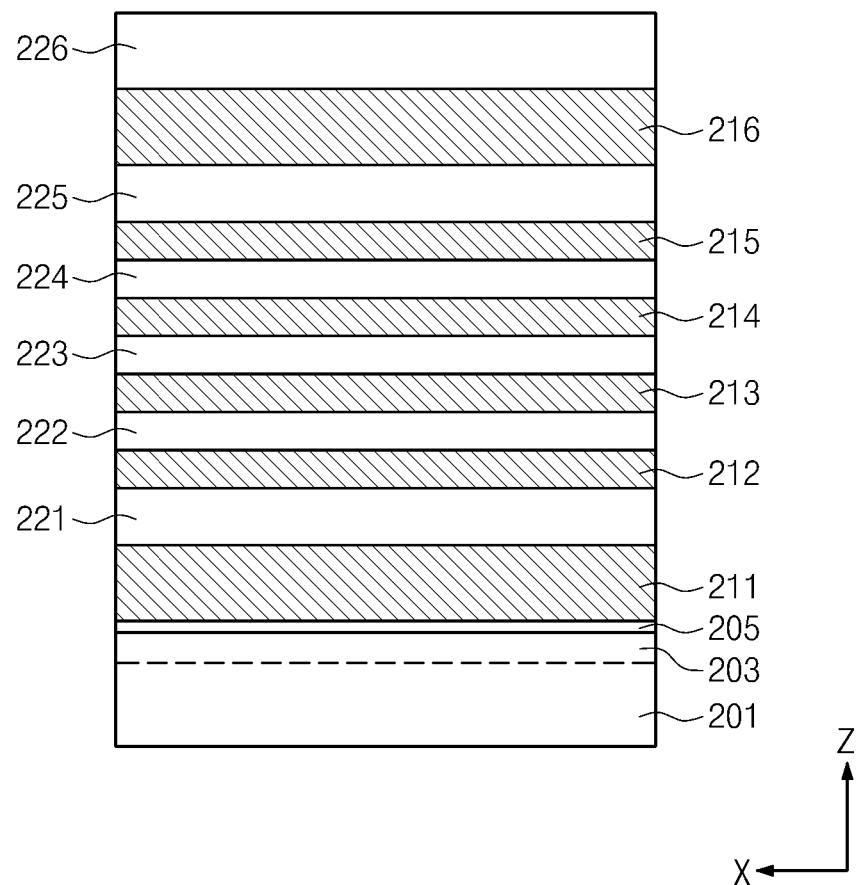
FIGS. 17A through 17F are cross-sectional views sequentially illustrating a method for fabricating the semiconductor device of FIG. 15.
Figure 18:
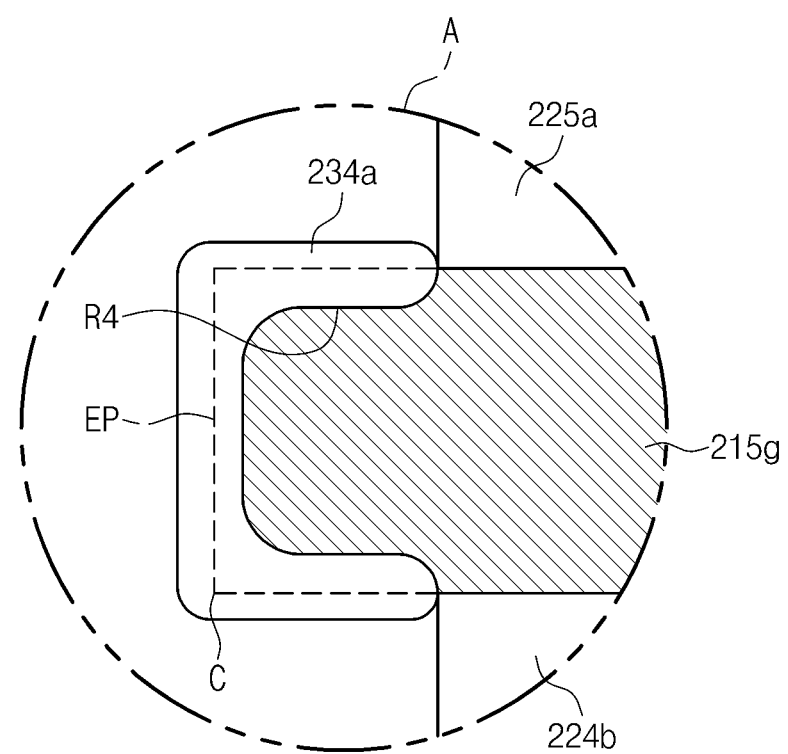
FIG. 18 is a detailed view of portion A of FIG. 17D.

Referring to FIG. 17A, a first impurity implantation region 203 that can be used as a common source region is formed in a semiconductor layer 201 in which a well is formed. A buffer layer 205 is formed on the semiconductor layer 201. The first impurity implantation region 203 may be formed after the buffer layer 205 is formed. The buffer layer 205 may protect a top surface of the semiconductor layer 201 or may function as an etch stop layer. Gate layers 211-216 and intergate dielectrics 221-226 are alternatingly stacked on the buffer layer 205. In one embodiment, the intergate dielectrics 221-226 and the buffer layer 205 can be formed of silicon oxide, while the gate layers 211-216 can comprise impurity-doped polysilicon layers.

Figure 17B:
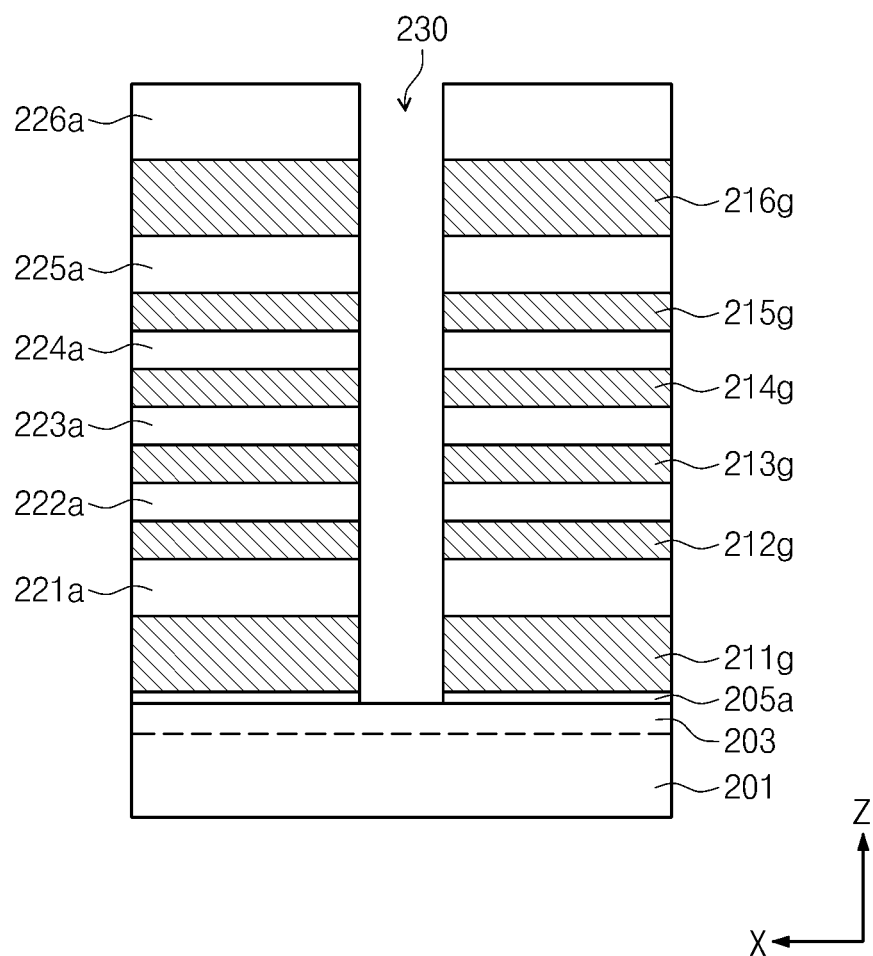

Referring to FIG. 17B, the intergate dielectrics 221-226, the gate layers 211-216 and the buffer layer 205 are sequentially patterned to form a first opening 230 exposing the semiconductor layer 201. The first opening 230 may have a hole shape. In doing so, the gate patterns 211g-216g, the intergate dielectric patterns 221a-226a and the buffer pattern 205a may be formed.

Figure 17C:
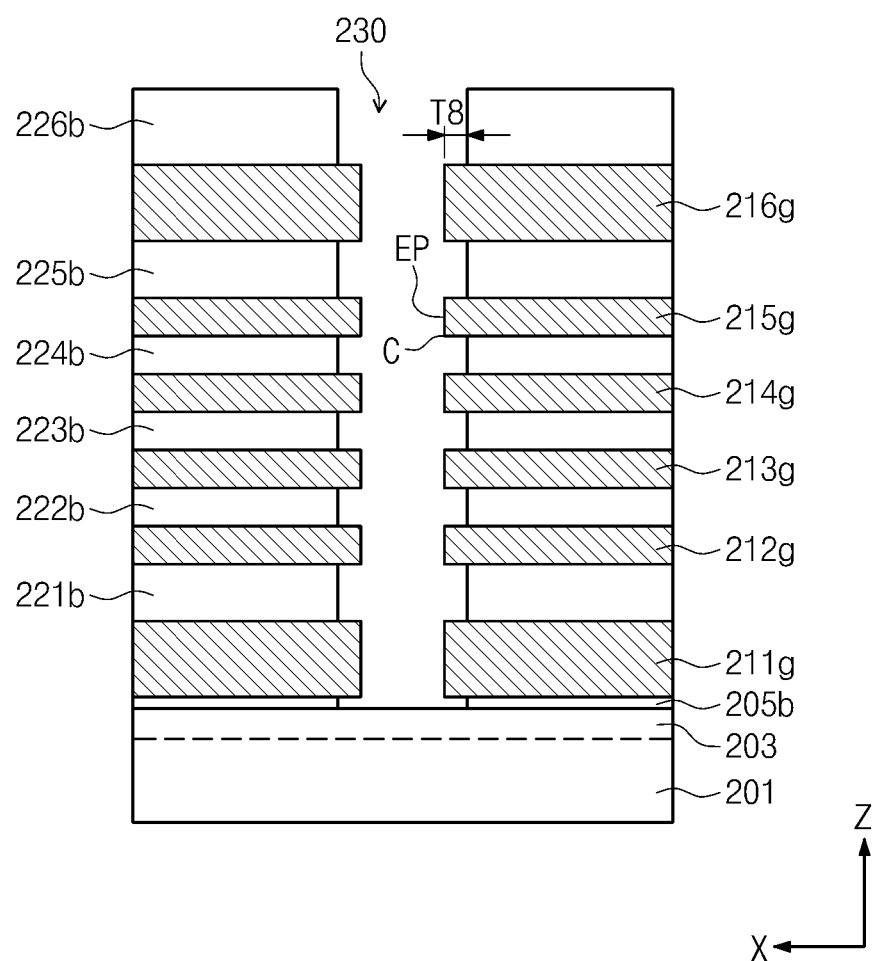

Referring to FIG. 17C, sidewalls of the intergate dielectric patterns 221b-226b exposed through the first opening 230 are removed to an eighth thickness T8 in the first horizontal direction X. In doing so, top surfaces and bottom surfaces of the gate patterns 211g-216g are partially exposed. At this time, inner ends EP of the exposed gate patterns 211g-216g, i.e., the exposed sidewalls and top surfaces, and the exposed sidewalls and bottom surfaces meet at a sharp angle so as to form a corner portion C. In the case where the buffer layer 205 is formed of the same material as the intergate dielectrics 221-226, a portion of a sidewall of the buffer pattern 205a may be removed to the same thickness by the etching process. By doing so, the intergate dielectric patterns 221a-226a and the buffer pattern 205a can become intergate dielectric patterns 221b-226b and a buffer pattern 205b whose sidewalls are partially removed.

Figure 17D:
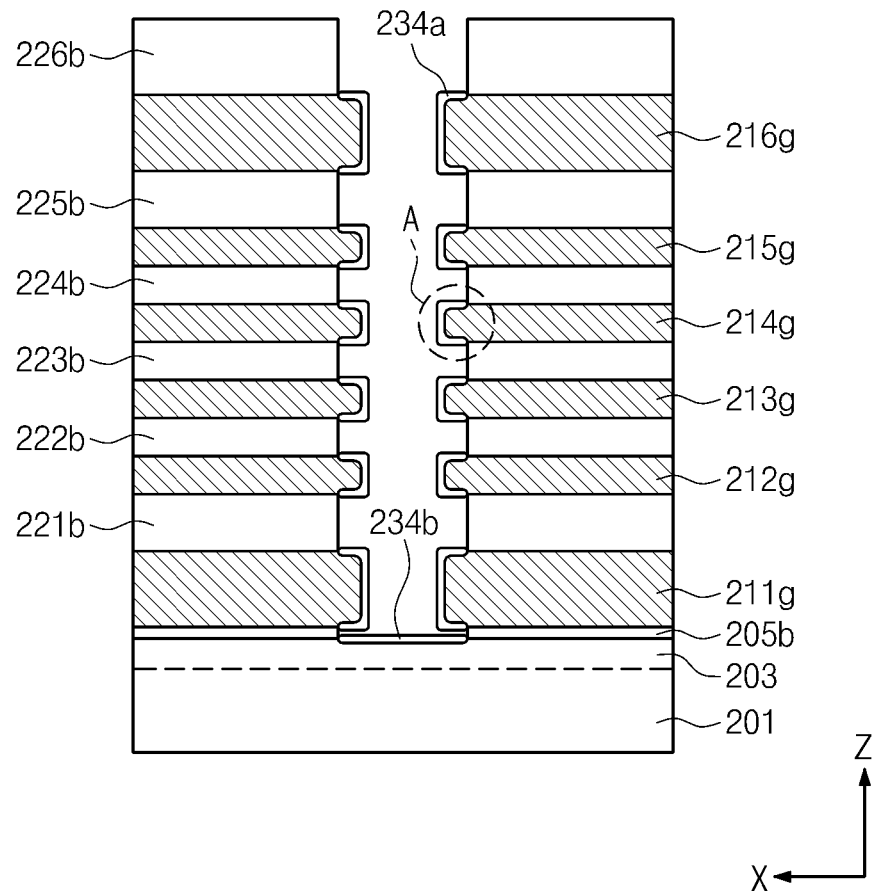

Referring to FIGS. 17D and 18, a process for rounding the angled end EP, including the sharp corners C of the gate patterns 211g-216g exposed through the first opening 230 is performed. That is, for this purpose, a thermal oxidation process is first performed to form a first oxide layer 234a on the angled end of the gate patterns 211g-216g exposed by the first opening 230. The first oxide layer 234a is formed as shown in FIG. 18. That is, Silicon (Si) and oxygen (O) in the end of the gate patterns 211g-216g made of a polysilicon layer are bonded to form a silicon oxide ($SiO_2$). At this time, since oxygen may readily penetrate the corner portion C of the gate patterns 211g-216g, a silicon oxide layer is readily formed, so that the thickness of the silicon oxide layer is relatively increased. At the same time, since oxygen has a difficult time penetrating contact portions between the gate patterns 211g-216g and the intergate dielectric patterns 221b-226b, a silicon oxide layer is not easily formed in these regions, so that the silicon oxide layer is relatively thin in these regions. Accordingly, the angled end EP of the gate patterns 211g-216g is made to be rounded. That is, by the formation of the first oxide layer 234a, the gate patterns 211g-216g have rounded surfaces R4. As a result of the oxidation process, a second oxide layer 234b is formed on a surface of the exposed semiconductor layer 201.

Figure 17E:
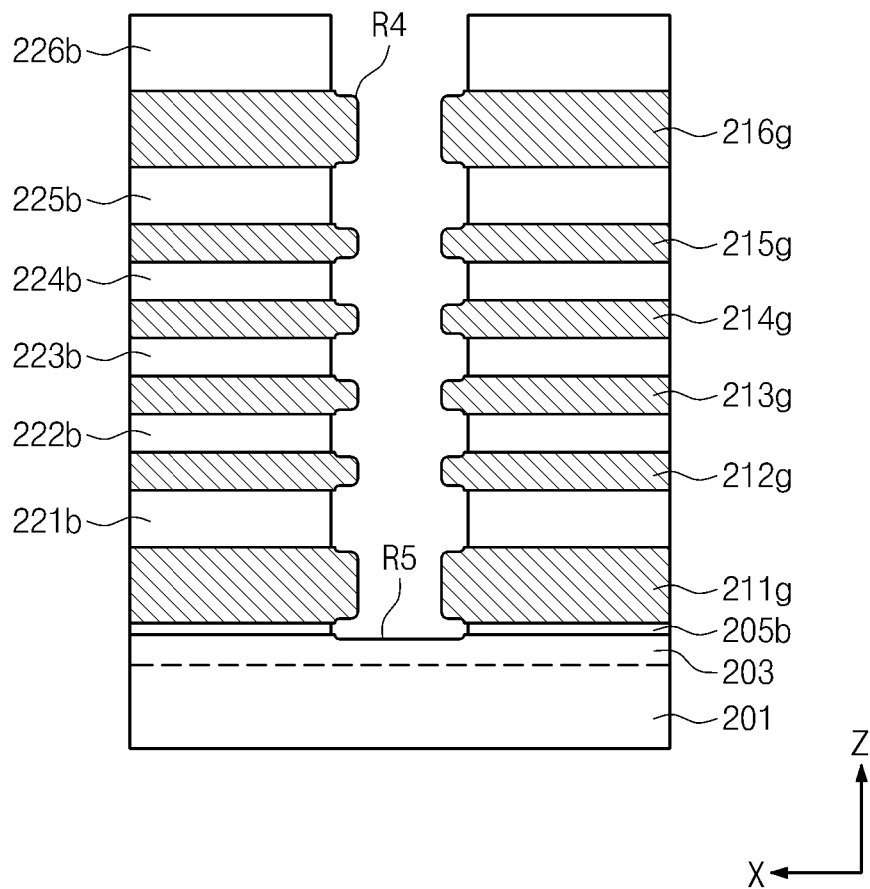

Referring to FIG. 17E, the oxide layers 234a, 234b are selectively removed. At this time, the sidewalls of the intergate dielectric patterns 221b-226b and the buffer pattern 205b that are in the same oxide series may be partially removed. By removing the second oxide layer 234b, a recessed region R5 may be formed on the surface of the semiconductor layer 201.

Figure 17F:
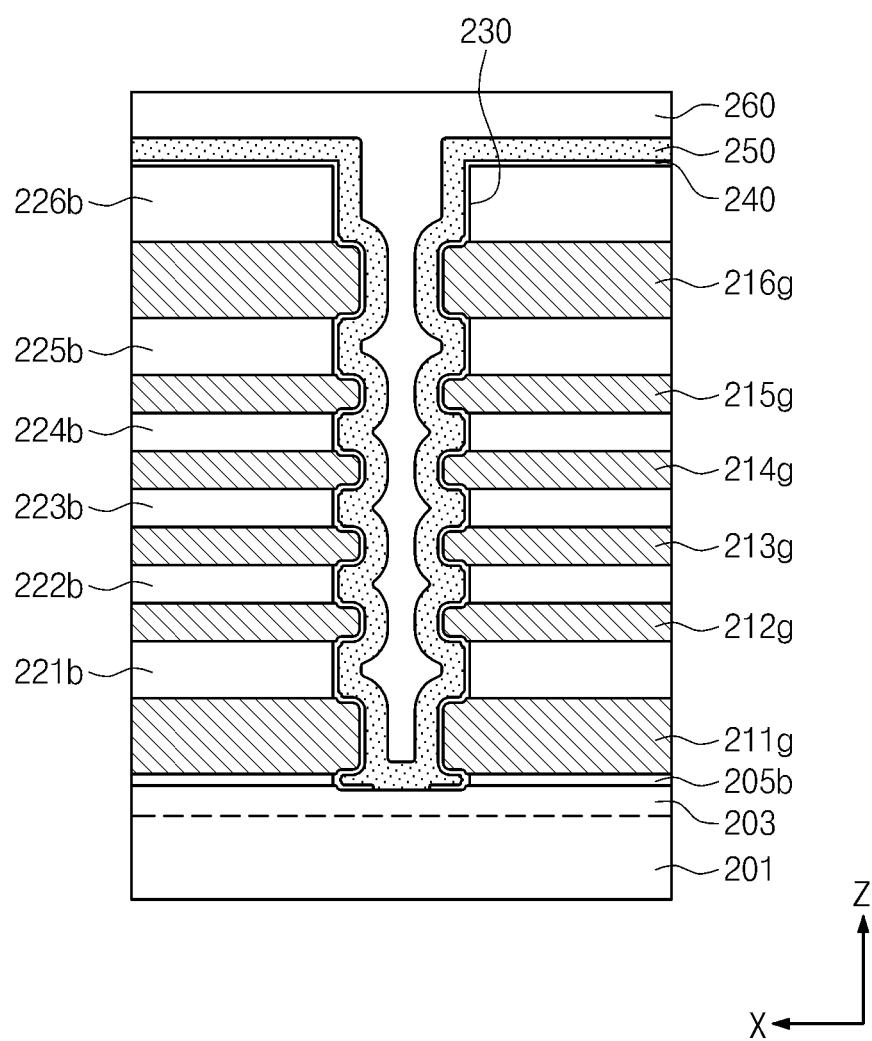

Referring to FIG. 17F, an information storage layer 240 is conformally formed on an entire surface of the resultant structure. The information storage layer 240 is formed so as to include a blocking dielectric 241, a charge trapping layer 242 and a tunnel dielectric 243, as shown in FIG. 16. The blocking dielectric 241 may be formed of a thermal oxide layer by using a thermal oxidation process. The rounded ends R4 of the gate patterns 211g-216g may be further rounded by the blocking dielectric 241 formed by the thermal oxidation process. The information storage layer 240 on the semiconductor layer 201 is partially removed to expose the semiconductor layer 201. Thereafter, an active pillar layer 250 is conformally formed on the semiconductor layer 201 and remaining portions of the information storage layer 240, including sidewalls of the first opening 230. Next, an inner dielectric 260 is applied to the resulting structure to fill the first opening 230.

Again referring to FIG. 15, a planarizing process is performed to remove the information storage layer 240, the active pillar layer 250 and the inner dielectric 260 disposed on the uppermost intergate dielectric pattern 226b so that the information storage layer 240, the active pillar 250a and the inner dielectric pattern 260a remain in the first opening 230. Thereafter, a third impurity implantation region 252 is formed at an upper portion of the active pillar 250a, and a conductive line 270 is formed thereon, as described above.

<Embodiment 9>

Figure 19:
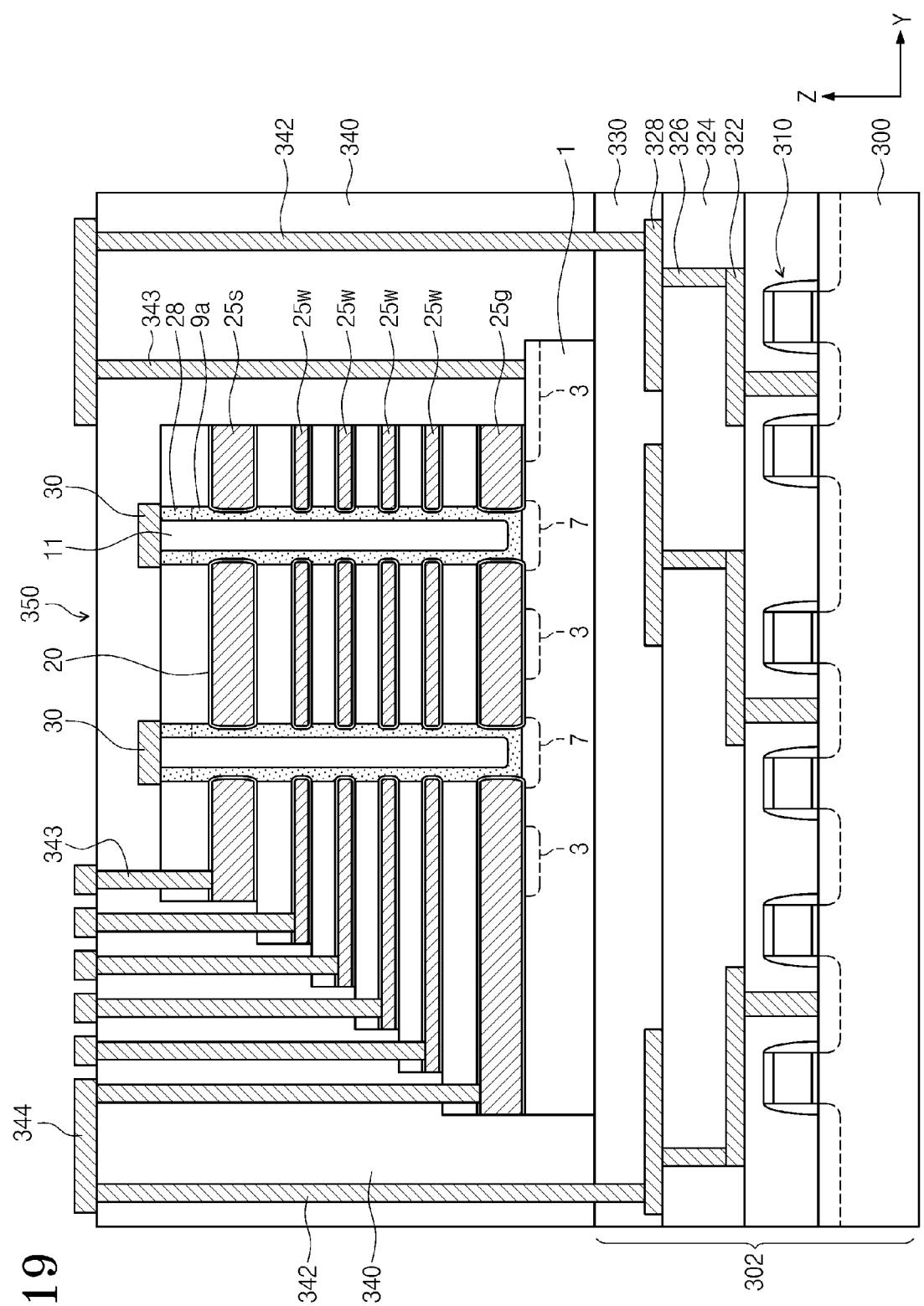
FIG. 19 is a cross-sectional view of a vertical type semiconductor device according to a ninth embodiment of the inventive concept.

FIG. 19 is a cross-sectional view of a vertical type semiconductor device according to ninth embodiment of the inventive concept. The present embodiment exemplarily illustrates a connection relationship between the vertical type memory cell structures disclosed in the above first through eighth embodiments and a peripheral circuit region of the device.

Referring to FIG. 19, a memory cell structure 350 is stacked on a peripheral circuit section 302. The peripheral circuit section 302 may include a peripheral circuit transistor 310, first and second lower interlayer dielectrics 324, 330, and peripheral circuit interconnections 322, 326, 328 disposed on a semiconductor substrate 300. The memory cell structure 350 disposed on the peripheral circuit section 302 may have a section similar to or the same as the section taken along line I-I of the first embodiment of FIG. 2. First ends of gate patterns 25g, 25w, 25s included in the memory cell structure 350 and disposed on the semiconductor layer 1 may have a stepped pattern with respect to their respective layers. The other ends of the gate patterns 25g, 25w, 25s may be aligned vertically. A portion of the semiconductor layer 1 adjacent to the other ends of the gate patterns 25g, 25w, 25s may be shaped to protrude in a horizontal direction, as compared to the first ends of the gate patterns 25g, 25w, 25s. A first impurity implantation region 3 that can be used as a common source line may be disposed in a predetermined portion of the semiconductor layer 1. The memory cell structure 350 is covered by an upper interlayer dielectric 340. Upper interconnections 344 are disposed on the upper interlayer dielectric 340. Each of the one ends of the gate patterns 25g, 25w, 25s having the step shape, and the first impurity implantation region 3 disposed at the predetermined portion of the semiconductor layer 1 are electrically connected with the upper interconnections 344 by an upper contact plug 343. The upper interconnections 344 is electrically connected with the peripheral circuit interconnection 328 by a connection contact plug 342 penetrating the upper interlayer dielectric 340 and a lower interlayer dielectric 330.

The present embodiment illustrates a configuration where a vertical type memory cell structure is disposed on the peripheral circuit region. In doing so, the resulting level of integration of the semiconductor device can be enhanced. In other embodiments, the vertical type memory cell structure and the peripheral circuit region can be disposed two-dimensionally, on a common plane. That is, the peripheral circuit region and the memory cell structure may be disposed on one plane such that the peripheral circuit region surrounds the memory cell structure, or alternatively, such that the memory cell region surrounds the peripheral circuit region.

Figure 20:
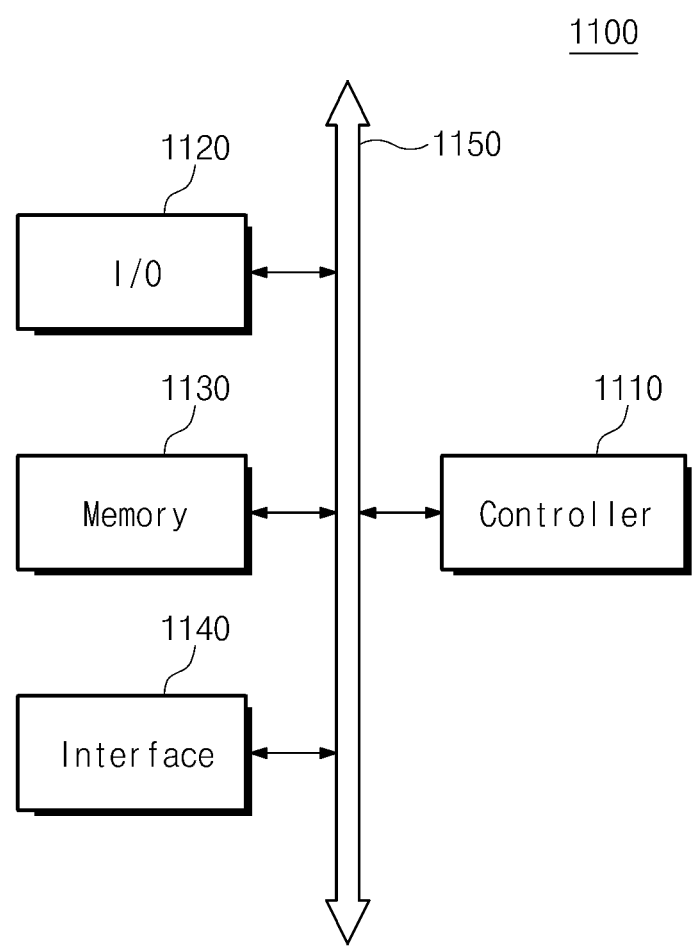
FIG. 20 is a block diagram of a memory system including a vertical type semiconductor device according to embodiments of the inventive concept.

FIG. 20 is a block diagram of a memory system including a vertical type semiconductor device according to embodiments of the inventive concept.

Referring to FIG. 20, a memory system 1100 may be applicable to PDAs, portable computers, Web tablets, wireless phones, mobile phones, digital music players, memory cards, or any device that can transmit and/or receive information in wireless environments.

The memory system 1100 includes a controller 1110, an input/output device 1120 (e.g., a keypad, a keyboard and a display), a memory 1130, an interface 1140, and a bus 1150. The memory 1130 and the interface 1140 communicate with each other through the bus 1150.

The controller 1110 includes at least one microprocessor, a digital signal processor, a microcontroller, or other similar processors. The memory 1130 may be used to store commands executed by the controller 1110. The input/output device 1120 may receive data or signals from the outside of the memory system 1100, or may output data or signals to the outside of the memory system 1100. For example, the input/output device 1120 may include a keyboard unit, a keypad unit, or a display unit.

The memory 1130 includes the nonvolatile memory devices according to the embodiments of the inventive concept. The memory 1130 may further include random-access volatile memories and other various types of memories.

The interface 1140 operates to transmit/receive data to/from a communication network.

Figure 21:
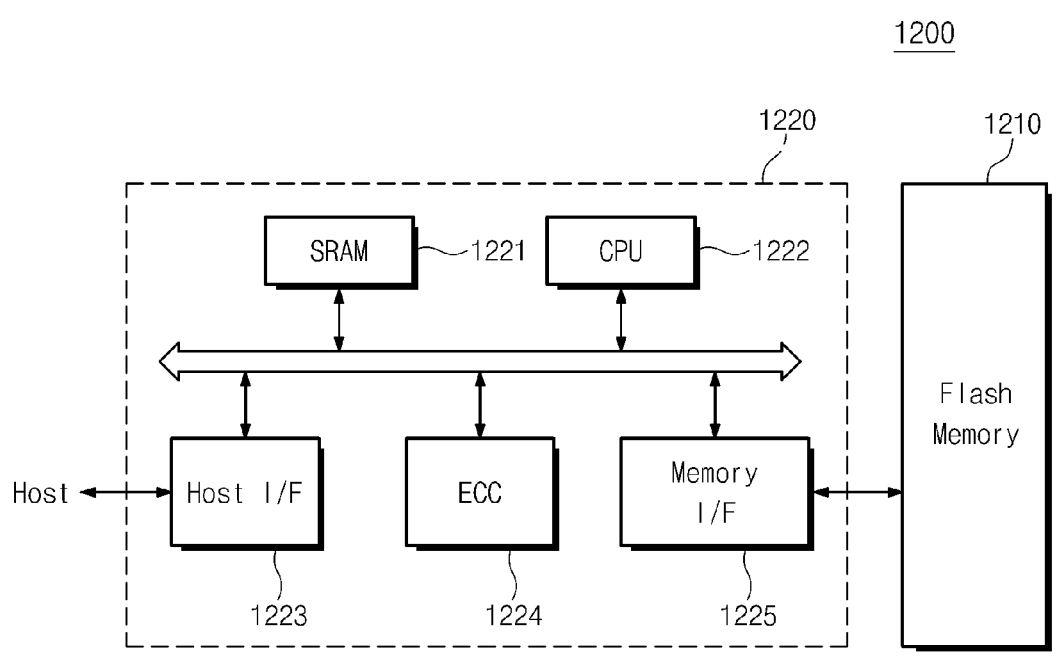
FIG. 21 is a block diagram of a memory card including a vertical type semiconductor device according to embodiments of the inventive concept.

FIG. 21 is a block diagram of a memory card provided with a vertical type semiconductor device according to embodiments of the inventive concept.

Referring to FIG. 21, a memory card 1200 is provided with a flash memory device 1210 according to the inventive concept to support high-capacity data storage capability. The memory card 1200 includes a memory controller 1220 that controls data exchange between a host and the flash memory device 1210.

An SRAM 1221 is used as a working memory of a central processing unit (CPU) 1222. A host interface (I/F) 1223 utilizes a data exchange protocol of a host connected to the memory card 1200. An error correction block (ECC) 1224 detects and corrects an error in data read from the multi-bit flash memory device 1210. A memory interface (I/F) 1225 interfaces with the flash memory device 1210. The CPU 1222 performs an overall control operation for data exchange of the memory controller 1220. Although not illustrated in FIG. 26, it will be apparent to those skilled in the art that the memory card 1200 may further include a ROM storing code data for interfacing with the host.

According to the flash memory device and the memory card or the memory system of the inventive concept, a memory system with high reliability can be provided through the flash memory device 1210 in which erase characteristics of dummy cells are improved. Especially, the flash memory device according to embodiments of the inventive concept can be provided in a memory system such as solid state disk (hereinafter referred to as 'SSD'), which are becoming popular in industry. In this case, read error caused by dummy cells can be prevented so as to realize a memory system with high reliability.

Figure 22:
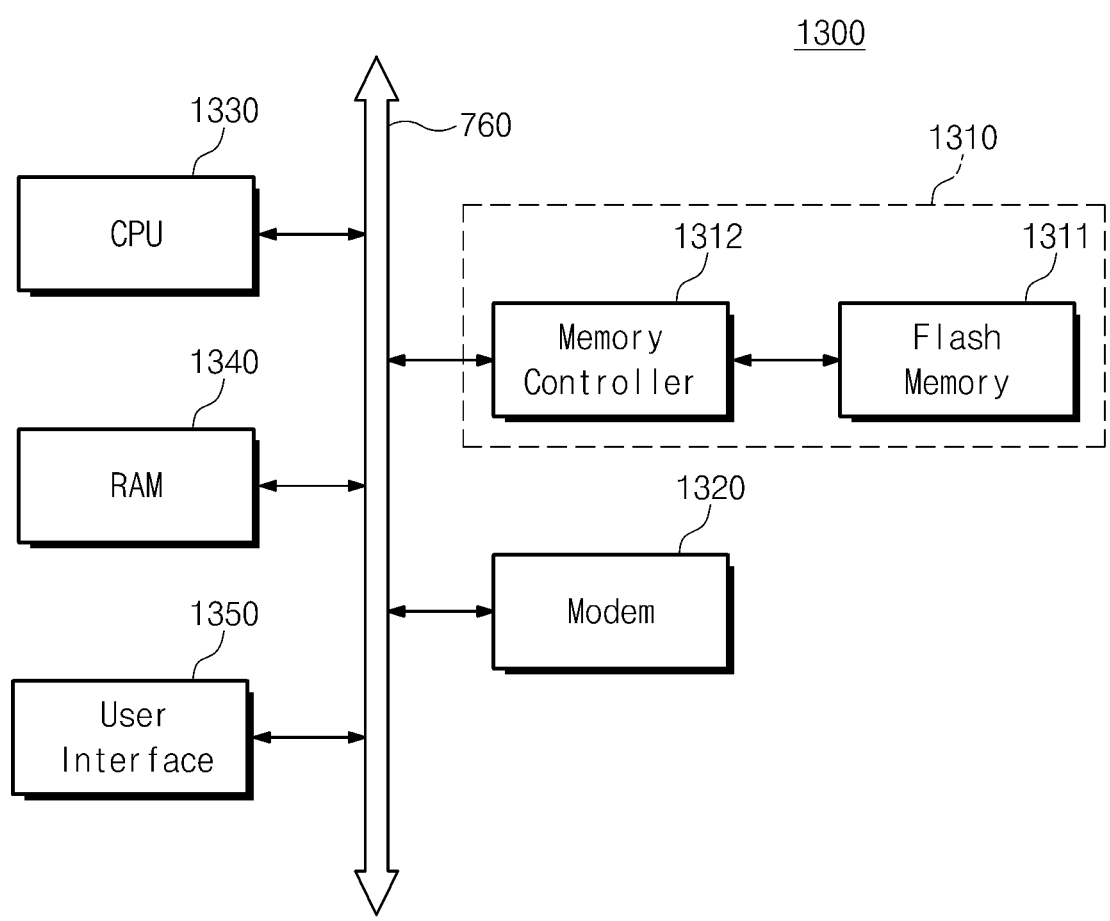
FIG. 22 is a block diagram of an information processing system including a vertical type semiconductor device according to the embodiments of the inventive concept.

FIG. 22 is a block diagram of an information processing system provided with a vertical type semiconductor device according to the embodiments of the inventive concept.

Referring to FIG. 22, an information processing system 1300, such as a mobile device and a desktop computer, is provided with a flash memory system 1310 according to the inventive concept. The information processing system 1300 includes a flash memory system 1310, a modem 1320, a central processing unit (CPU) 1330, a RAM 1340, and a user interface 1350 that are electrically connected to a system bus 1360. The flash memory system 1310 may have substantially the same configuration as the aforementioned memory system or flash memory system. Data processed by the CPU 1330 or external input data is stored in the flash memory system 1310. The flash memory system 1310 may be configured with a semiconductor disk device (SSD). In this case, the information processing system 1300 can stably store high-capacity data in the flash memory system 1310. Also, as the reliability of the semiconductor device is improved, the flash memory system 1310 can save resources consumed in error correction, thus providing a high-speed data exchange function to the information processing system 1300. Although not illustrated in FIG. 27, it will be apparent to those skilled in the art that the information processing system 1300 may further include an application chipset, a camera image processor (CIS), and an input/output device.

Also, the flash memory device or the memory system according to the inventive concept may be mounted in various types of packages. Examples of the packages of the flash memory device or the memory system according to the inventive concept include Package on Package (PoP), Ball Grid Arrays (BGAs), Chip Scale Packages (CSPs), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), Thin Quad Flat Pack (TQFP), System In Package (SIP), Multi Chip Package (MCP), Wafer-level Fabricated Package (WFP), and Wafer-level Processed Stack Package (WSP).

In a semiconductor device according to an example of the inventive concept, the active pillar has a sidewall with an irregular shape, and thus a distance from a point on the surface of the active pillar adjacent to the gate pattern to the sidewall of the gate pattern is relatively closer. As a result the fringe field is relatively stronger, and the resulting inversion region is more readily formed. Also, in some embodiments, the thickness of the active pillar (i.e., channel region) adjacent to the gate pattern may be thinner than the thickness of the active pillar (i.e., source/drain region) adjacent to the intergate dielectric pattern. In some embodiments, as the thickness of the channel region of the active pillar is relatively thin, the trap density of charge is decreased and thus the threshold voltage distribution of cell memory transistors can be improved. Also, since the thickness of the source/drain region of the active pillar is relatively thick, the transfer rate of charge can be increased. In some embodiments, since the contact area between the active pillar and the gate dielectric layer is increased, the channel length can be increased to mitigate or eliminate the short channel effect. Also, in some embodiments, since the surface of the active pillar contacting the gate dielectric layer is not sharply angled but is instead rounded, concentration of the electric field can be prevented to thereby increase the reliability of the gate dielectric layer. In doing so, sensing margin can be enhanced and a reliable vertical type semiconductor device can be realized.

The above-disclosed subject matter is to be considered illustrative and not restrictive, and the appended claims are intended to cover all such modifications, enhancements, and other embodiments, which fall within the true spirit and scope of the inventive concept. Thus, the scope of the inventive concept is to be determined by the broadest permissible interpretation of the following claims and their equivalents, and shall not be restricted or limited by the foregoing detailed description.

What is claimed is:

1. A semiconductor device comprising:
    a substrate of semiconductor material extending in a horizontal direction;
    a plurality of interlayer dielectric layers on the substrate;
    a plurality of gate patterns, each gate pattern between a neighboring lower interlayer dielectric layer and a neighboring upper interlayer dielectric layer;
    a vertical channel of semiconductor material on the substrate and extending in a vertical direction through the plurality of interlayer dielectric layers and the plurality of gate patterns, the vertical channel having an outer sidewall, the outer sidewall having a plurality of channel recesses, each channel recess corresponding to a gate pattern of the plurality of gate patterns, the vertical channel having an inner sidewall; and
    an information storage layer in the recess between each gate pattern and the vertical channel that insulates the gate pattern from the vertical channel.

2. The semiconductor device of claim 1 wherein the vertical channel has a cup shape and further comprising a vertical channel insulator that fills a vertical cavity in the vertical channel.

3. The semiconductor device of claim 1 wherein the vertical channel comprises first and second opposed plates that are spaced apart from each other and further comprising a vertical channel insulator between the first and second opposed plates.

4. The semiconductor device of claim 1 further comprising an etch stop layer positioned between a lowermost gate pattern of the plurality of gate patterns and the substrate.

5. The semiconductor device of claim 1 wherein a lowermost gate pattern of the plurality of gate patterns is positioned in a substrate recess in a top surface of the substrate.

6. The semiconductor device of claim 1 wherein each channel recess has a rounded concave surface that is opposite a corresponding one of the gate patterns having a mating rounded convex surface, and wherein the rounded convex surface of each gate pattern is positioned in a rounded concave surface of a corresponding channel recess.

7. The semiconductor device of claim 6 wherein the mating rounded convex surface of the gate pattern positioned in the channel recess has a width in the vertical direction that is greater than a thickness of a body portion of the gate pattern positioned between the neighboring lower interlayer dielectric layer and the neighboring upper interlayer dielectric layer of the gate pattern.

8. The semiconductor device of claim 6 wherein the mating rounded convex surface of the gate pattern positioned in the channel recess has a width in the vertical direction that is less than a thickness of a body portion of the gate pattern positioned between the neighboring lower interlayer dielectric layer and the neighboring upper interlayer dielectric layer of the gate pattern.

9. The semiconductor device of claim 1 wherein a first distance between the outer sidewall and the inner sidewall of a first portion of the vertical channel adjacent the channel recess in a horizontal direction is less than a second distance between the outer sidewall and an inner sidewall of a second portion of the vertical channel adjacent the interlayer dielectric layer in the horizontal direction.

10. The semiconductor device of claim 1 wherein the information storage layer further extends in a horizontal direction between the gate pattern and the neighboring upper interlayer dielectric layer; and extends in the horizontal direction between the gate pattern and the neighboring lower interlayer dielectric layer.

11. The semiconductor device of claim 1 wherein:
an upper-most gate pattern of the plurality of gate patterns comprises an upper select gate of an upper select transistor;
a lower-most gate pattern of the plurality of gate patterns comprises a lower select gate of a lower select transistor;
remaining gate patterns of the plurality of gate patterns between the upper select gate and the lower select gate comprise control gates of memory cell transistors of a common string of the semiconductor device;
control gates of memory cell transistors sharing a same layer of the device arranged in a first horizontal direction of the semiconductor device are connected to provide word lines of the semiconductor device;
memory cell transistors of a common string of the semiconductor device are coupled together in series by the vertical channel;
upper portions of vertical channels arranged in a second horizontal direction of the semiconductor device are connected to provide bit lines of the semiconductor device; and
the semiconductor device comprises a semiconductor memory device.

12. The semiconductor device of claim 1, wherein the inner sidewall is linear in extension in the vertical direction.

13. A semiconductor device comprising:
a substrate of semiconductor material extending in a horizontal direction;
a plurality of interlayer dielectric layers on the substrate;
a plurality of gate patterns, each gate pattern between a neighboring lower interlayer dielectric layer and a neighboring upper interlayer dielectric layer;
a vertical channel of semiconductor material on the substrate and extending in a vertical direction through the plurality of interlayer dielectric layers and the plurality of gate patterns, the vertical channel having an outer sidewall, the outer sidewall having a plurality of channel recesses, each channel recess corresponding to a gate pattern of the plurality of gate patterns, a lowermost gate pattern of the plurality of gate patterns being positioned in a substrate recess in a top surface of the substrate; and
an information storage layer in the channel recess between each gate pattern and the vertical channel that insulates the gate pattern from the vertical channel.

14. The semiconductor device of claim 13, wherein the vertical channel further has an inner sidewall, the inner sidewall being linear in extension in the vertical direction.

15. The semiconductor device of claim 13, wherein the vertical channel has a cup shape and further comprising a vertical channel insulator that fills a vertical cavity in the vertical channel.

16. The semiconductor device of claim 13, wherein the vertical channel is solid between the outer sidewalls.

17. The semiconductor device of claim 13, wherein the vertical channel comprises first and second opposed plates that are spaced apart from each other and further comprising a vertical channel insulator between the first and second opposed plates.

18. The semiconductor device of claim 13, further comprising an etch stop layer positioned between a lowermost gate pattern of the plurality of gate patterns and the substrate.

19. The semiconductor device of claim 13, wherein each channel recess has a rounded concave surface that is opposite a corresponding one of the gate patterns having a mating rounded convex surface, and wherein the rounded convex surface of each gate pattern is positioned in a rounded concave surface of a corresponding channel recess.

20. The semiconductor device of claim 19, wherein the mating rounded convex surface of the gate pattern positioned in the channel recess has a width in the vertical direction that is greater than a thickness of a body portion of the gate pattern positioned between the neighboring lower interlayer dielectric layer and the neighboring upper interlayer dielectric layer of the gate pattern.

21. The semiconductor device of claim 19, wherein the mating rounded convex surface of the gate pattern positioned in the channel recess has a width in the vertical direction that is less than a thickness of a body portion of the gate pattern positioned between the neighboring lower interlayer dielectric layer and the neighboring upper interlayer dielectric layer of the gate pattern.

22. The semiconductor device of claim 19, wherein the vertical channel further has an inner sidewall and wherein a first distance between the outer sidewall and the inner sidewall of a first portion of the vertical channel adjacent the channel recess in a horizontal direction is less than a second distance between the outer sidewall and an inner sidewall of a second portion of the vertical channel adjacent the interlayer dielectric layer in the horizontal direction.

23. The semiconductor device of claim 13, wherein the information storage layer further extends in a horizontal direction between the gate pattern and the neighboring upper interlayer dielectric layer; and extends in the horizontal direction between the gate pattern and the neighboring lower interlayer dielectric layer.

24. The semiconductor device of claim 13, wherein:
an upper-most gate pattern of the plurality of gate patterns comprises an upper select gate of an upper select transistor;
a lower-most gate pattern of the plurality of gate patterns comprises a lower select gate of a lower select transistor;
remaining gate patterns of the plurality of gate patterns between the upper select gate and the lower select gate comprise control gates of memory cell transistors of a common string of the semiconductor device;
control gates of memory cell transistors sharing a same layer of the device arranged in a first horizontal direction of the semiconductor device are connected to provide word lines of the semiconductor device;
memory cell transistors of a common string of the semiconductor device are coupled together in series by the vertical channel;
upper portions of vertical channels arranged in a second horizontal direction of the semiconductor device are connected to provide bit lines of the semiconductor device; and
the semiconductor device comprises a semiconductor memory device.

* * * * *